(12) United States Patent
Lauxtermann et al.

(10) Patent No.: US 7,790,608 B2
(45) Date of Patent: Sep. 7, 2010

(54) BURIED VIA TECHNOLOGY FOR THREE DIMENSIONAL INTEGRATED CIRCUITS

(75) Inventors: Stefan C. Lauxtermann, Camarillo, CA (US); Jeffrey F. DeNatale, Thousand Oaks, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 0 days.

(21) Appl. No.: 12/710,323

(22) Filed: Feb. 22, 2010

(65) Prior Publication Data

US 2010/0151625 A1    Jun. 17, 2010

Related U.S. Application Data

(63) Continuation of application No. 11/624,633, filed on Jan. 18, 2007, now Pat. No. 7,671,460.

(60) Provisional application No. 60/766,526, filed on Jan. 25, 2006.

(51) Int. Cl.
*H01L 21/4763* (2006.01)
(52) U.S. Cl. ............................... 438/637; 257/E23.085
(58) Field of Classification Search ................ 438/637; 257/E23.085
See application file for complete search history.

(56) References Cited

U.S. PATENT DOCUMENTS

| | | | |
|---|---|---|---|
| 4,956,716 A | 9/1990 | Hewitt et al. |
| 5,303,027 A | 4/1994 | Kuderer et al. |
| 5,471,515 A | 11/1995 | Fossum et al. |
| 5,847,594 A | 12/1998 | Mizuno |
| 6,011,251 A | 1/2000 | Dierickx et al. |
| 6,121,843 A | 9/2000 | Vampola et al. |
| 6,157,170 A | 12/2000 | Noda et al. |
| 6,300,613 B1 | 10/2001 | Kuderer |
| 6,326,603 B1 | 12/2001 | Kuderer |
| 6,455,837 B2 | 9/2002 | Mizuno |
| 6,486,504 B1 | 11/2002 | Guidash |
| 6,603,109 B2 | 8/2003 | Pantigny et al. |
| 6,642,496 B1 | 11/2003 | Gulbransen |
| 6,642,503 B2 | 11/2003 | Kummaraguntla et al. |
| 6,664,777 B2 | 12/2003 | Hyakutake et al. |
| 6,678,039 B2 | 1/2004 | Charbon |
| 6,713,796 B1 | 3/2004 | Fox |

(Continued)

OTHER PUBLICATIONS

"CMOS Minimal array", Janesick et al., *Proceedings of the SPIE*. vol. 6295. (2006): 62950O, 15 pages.

(Continued)

*Primary Examiner*—David S Blum
(74) *Attorney, Agent, or Firm*—Snell & Wilmer L.L.P.

(57) ABSTRACT

A three dimensional integrated circuit and method for making the same. The three dimensional integrated circuit has a first and a second active circuit layers with a first metal layer and a second metal layer, respectively. The metal layers are connected by metal inside a buried via. The fabrication method includes etching a via in the first active circuit layer to expose the first metal layer without penetrating the first metal layer, depositing metal inside the via, the metal inside the via being in contact with the first metal layer, and bonding the second active circuit layer to the first active circuit layer using a metal bond that connects the metal inside the via to the second metal layer of the second active circuit layer.

19 Claims, 23 Drawing Sheets

U.S. PATENT DOCUMENTS

| | | | |
|---|---|---|---|
| 6,885,047 | B2 | 4/2005 | Shinohara et al. |
| 6,919,549 | B2 | 7/2005 | Bamji et al. |
| 6,977,601 | B1 | 12/2005 | Fletcher et al. |
| 6,977,682 | B2 | 12/2005 | Mizuno et al. |
| 7,115,925 | B2 | 10/2006 | Rhodes |
| 7,138,287 | B2 | 11/2006 | Mouli et al. |
| 7,157,685 | B2 | 1/2007 | Bamji et al. |
| 7,202,463 | B1 | 4/2007 | Cox |
| 7,244,919 | B2 | 7/2007 | Ishikawa et al. |
| 7,326,903 | B2 | 2/2008 | Ackland |
| 7,388,413 | B1 | 6/2008 | Ball |
| 7,453,131 | B2 | 11/2008 | Marshall et al. |
| 2003/0213984 | A1 | 11/2003 | Berezin et al. |
| 2005/0092894 | A1 | 5/2005 | Fossum |
| 2005/0167709 | A1 | 8/2005 | Augusto |
| 2006/0181627 | A1 | 8/2006 | Farrier |
| 2007/0194356 | A1 | 8/2007 | Moon et al. |

OTHER PUBLICATIONS

"Fabrication and Initial Results for a Back-Illuminated Monolithic APS in a Mixed SOI/bulk CMOS Technology", Bedabrata pain, *As presented at the Jun. 2005 IEEE Workshop on Charge-Coupled Devices and Advanced Image Sensors*, pp. 102-104.

"Design of High-Performance Microprocessor Circuits", Chandrakasan et al., *IEEE Press*, pp. 285-308, 2001.

"Back-Gate Controlled READ SRAN with Improved Stability", Jae-Joon Kim, et al., *IEEE International SOI Conference*, pp. 211-212, 2005.

"An SOI 4 Transistors Self-Refresh Ultra-Low-Voltage Memory Cell", Oliver Thomas, *ISCAS*, pp. V-401-V-404, May 2003.

"3-D ICs: A Novel Chip Design for Improving Deep-Submicrometer Interconnect Performance and Systems-on-Chip Integration," Banerjee et al., *Proceedings of the IEEE*, vol. 89, N. 5, pp. 602-633, May 2001.

"A 0.18 μm CMOS 1000 frames/sec, 138dB Dynamic Range Readout Circuit for 3D-IC Focal Plane Arrays", Kavusi et al., Department of Electrical Engineering, Stanford University, 4 pages.

"Chip-to-Chip Interconnections Based on the Wireless Capacitive Coupling for 3D Integration", Charlet et al., *Microelectronic Engineering 83*, pp. 2195-2199, 2006.

"CMOS Image Sensors", Gamal et al., *IEEE Circuits & Devices Magazine*, pp. 6-20, May/Jun. 2005.

"CMOS Image Sensors: Electronic Camera-On-A-Chip", Eric R. Fossum, *IEEE Transactions on Electron Devices*, vol. 44, No. 10, pp. 1689-1698, Oct. 1997.

"A Computational Image Sensor with Adaptive Pixel-Based Integration Time", Hamamoto et al., *IEEE Journal of Solid-State Circuits*, vol. 36, No. 4, pp. 580-585, Apr. 2001.

"Demystifying 3D ICs: The Pros and Cons of Going Vertical", Davis Rhett W. et al., IEEE Design & Test of Computers; pp. 498-510; 2005.

"Development of a Production-Ready, Black-Illuminated CMOS Image Sensor with Small Pixels", Joy et al., IEEE, pp. 1007-1010, 2007.

"Folded Multiple-Capture: An Architecture for High Dynamic Range Disturbance-Tolerant Focal Plane Array", Kavusi et al., *Proc. Of SPIE*, vol. 5406, pp. 351-360, 2004.

"High Density Vertical Interconnects for 3-D Integration of Silicon Integrated Circuits", Bower et al., *2006 Electronic Components and Technology Conference*, pp. 399-403, 2006.

"In-Pixel Autoexposure CMOS APS," Yadid-Pecht et al., *IEEE Journal of Solid-State Circuits*, vol. 38, No. 8, pp. 1425-1428, Aug. 2003.

"Intelligent Image Sensor Chip with Three Dimensional Structure", Kurino et al., *IEDM*, pp. 879-882, 1999.

"Neuromorphic Vision Chip Fabricated Using Three-Dimensional Integration Technology", Koyanagi et al., *IEEE International Solid-State Circuits Conference*, 3 pages, Feb. 7, 2001.

"Proximity Communication", Drost et al., *IEEE Journal of Solid-State Circuits*, vol. 39, No. 9, pp. 1529-1535, Sep. 2004.

"Quantitative Study of High Dynamic Range Image Sensor Architectures", Kavusi, et al., *SPIE-IS&T*, vol. 5301, pp. 264-275, 2004.

"Scientific CMOS Pixels", Janesick et al., *Scientific CMOS Pixels*, pp. 103-114.

"Synthesis of high Dynamic Range Motion Blur Free Image From Multiple Captures", *IEEE Transactions on Circuits and Systems- I: Fundamental Theory and Applications*, vol. 50, No. 4, pp. 530-539, Apr. 2003.

"Vertically-Integrated Sensor Arrays-VISA", Horn et al., *Proc. of SPIE*, vol. 5406, pp. 332-340, 2004.

"A Wafer-Scale 3-D Circuit Integration Technology", Burns et al., *IEEE Transactions on Electron Devices*, vol. 53, No. 10, pp. 2507-2516, Oct. 2006.

"Wide-Dynamic-Range Sensors", Yadid-Pecht et al., *Optical Engineering*, vol. 38, No. 10, pp. 1650-1660, Oct. 1999.

"Wide Intrascene Dynamic Range CMOS APS Using Dual Sampling", Yadid-Pecht, *IEEE Transactions on Electron Devices*, vol. 44, No. 10, pp. 1721-1723, Oct. 1997.

"PVT-Aware Leakage Reduction for On-Die Caches with Improved Read Stability", Kim et al., 2005 IEEE International Solid State Circuits Conference, pp. 13-15, Feb. 9, 2005.

US 7,790,608 B2

BURIED VIA TECHNOLOGY FOR THREE DIMENSIONAL INTEGRATED CIRCUITS

CLAIM OF PRIORITY UNDER 35 U.S.C. §119

This application is a continuation of U.S. patent application Ser. No. 11/624,633, filed Jan. 18, 2007, now U.S. Pat. No. 7,671,460, which claims the benefit of U.S. provisional patent application No. 60/766,526, filed Jan. 25, 2006, the entire disclosure of each of these applications are incorporated herein by reference.

BACKGROUND OF THE INVENTION

1. Field of the Invention

The invention relates generally to integrated circuits. More particularly, the invention relates to buried via technology for three dimensional integrated circuits.

2. Description of Related Art

Three dimensional integrated circuit (IC) technology provides powerful capability for increased IC functionality. The three dimensional IC technology utilizes a multi-layer of active circuitry stacked up one on top of the other. Each active layer may consist of several metal layers with a thickness of about 1 micron each, forming an electric interconnect network between active devices, such as transistors.

To fully exploit three dimensional IC technology, high density vertical interconnects with conductive wiring between stacked active circuit layers is required. FIG. 1 illustrates a prior art vertical interconnect, such as a through via 11, between metal layers 13, 15, 17 and 19 for active circuitry. The size of through via 11 should be compatible with feature size of the underlying lateral process technology.

Most approaches to three-dimensional IC technology rely on through via 11. However, through vias 11 have several disadvantages. First, through vias 11 create an exclusion zone that interrupts the routing in all metal layers 13, 15, 17 and 19, as shown in FIG. 1. Through vias 11 penetrate, not only through a wafer 21, but also through the stacked metal layers 13, 15, 17 and 19 and interrupt the circuit routing. This creates exclusion area constraints that make combination with state of the art 2-dimensional circuit technologies difficult and inefficient.

Second, routing streets in line with through via 11 are blocked by the through via 11, as shown in FIG. 2. A conductive wiring 23 coated with an interlayer dielectric travels through the via 11. This wiring 23 blocks the routing of streets 25 and 27 in line with the through via 11. Hence, the routing streets are blocked in both dimensions, on all metal layers.

Third, the top level metal routing street in line with the landing pad 33, for example metal layer 19, is blocked by the landing pad 33, as shown in FIG. 2. The conductive wiring 23 travels through the via 11, comes out of via 11, and goes through at least the top metal layer 19 at the location of the landing pad 33. Consequently, the landing pad 33 blocks the routing in streets 29 and 31 in line with the landing pad 33. Hence, the routing streets are blocked on the top metal layer 19 at the landing pad 33 as well. Since the top metal layer 19 typically has the lowest electrical resistance of all metal layers in an integrated circuit process, it is used for power routing. Blocking this power routing layer is problematic.

With an ever increasing demand for improved integrated circuits technology, there remains a need in the art for buried via technology in three dimensional integrated circuits that provides a high density vertical interconnect with minimal exclusion zones while maintaining compatibility with two dimensional processed integrated circuits.

SUMMARY OF THE INVENTION

A three dimensional integrated circuit and method for making the same. In one embodiment, the three dimensional integrated circuit has a first, a second and a third active circuit layer. The first active circuit layer is deposited on a substrate wafer. The second active circuit layer is coupled to the first active circuit layer using conventional hybridization techniques. The second active circuit layer has a buried via and a first metal layer. The first metal layer is embedded in a first dielectric material in the second active circuit layer. The buried via is etched through the first dielectric material to expose the first metal layer. The buried via contains metal in contact with the first metal layer of the second active circuit layer. The third active circuit layer has a second metal layer. The second metal layer is embedded in a second dielectric material in the third active circuit layer. The second dielectric material has an opening that exposes the second metal layer of the third active circuit layer. The opening is aligned above the buried via of the second active circuit layer. The opening contains a metal bond that mechanically couples the third active circuit layer to the second active circuit layer and electrically couples the first metal layer of the second active circuit layer to the second metal layer of the third active circuit layer.

According to an embodiment of the invention, the fabrication method for the three dimensional integrated circuit includes placing a first active circuit layer on a first substrate and a second active circuit layer on a second substrate, the first active circuit layer having a first metal layer embedded in a first dielectric material of the first active circuit layer, the second active circuit layer having a second metal layer embedded in a second dielectric material of the second active circuit layer, hybridizing the first active circuit layer to a handling wafer, etching the first substrate to uncover the first dielectric material of the first active circuit layer, etching a via through the first dielectric material to uncover the first metal layer in the first active circuit layer, depositing metal inside the via, the metal inside the via being in contact with the first metal layer, etching an opening in the second dielectric material to uncover the second metal layer in the second active circuit layer, aligning the opening in the second active circuit layer with the via of the first active circuit layer, and hybridizing the second active circuit layer to the first active circuit layer using a metal bond that connects the metal inside the via to the second metal layer of the second active circuit layer.

In another embodiment, the three dimensional integrated circuit has an active circuit layer of non-separated dies on an entire wafer, a first known good die and a second known good die. The active circuit layer is deposited on a substrate wafer. The first known good die has a buried via, a buried oxide layer and a first metal layer. The first metal layer is embedded in a first dielectric material of the first known good die. A via hole is etched through the buried oxide layer, the semiconductor substrate layer and the first dielectric material to expose the first metal layer without penetrating it. The buried via contains metal in contact with the first metal layer. The first known good die is coupled to the active circuit layer in a hybridization step. In this hybridization, electrical connections are made between the first metal layer of the first known good die and the active circuit layer wafer. There is one good die coupled to every non-separated die on the active circuit layer wafer. All known good dies on the active circuit layer wafer are then thinned using the buried oxide layer as an etch stop. The second known good die is then coupled to the first known good die. The second known good die has a second metal layer. The second metal layer is embedded in a second dielectric material of the second known good die. The second dielectric material has an opening that exposes the second metal layer. The opening is aligned above the buried via of the first known good die. The opening contains a metal bond that mechanically couples the second known good die to the first known good die and electrically couples the first metal layer of the first known good die to the second metal layer of the second known good die.

According to an embodiment of the invention, the fabrication method for the three dimensional integrated circuit includes etching a via hole in the first known good die to expose the first metal layer without penetrating it, depositing metal inside the via hole, the metal inside the via hole being in contact with the first metal layer, and bonding the second known good die to the first known good die using a metal bond that connects the metal inside the via hole to the second metal layer of the second known good die. The metal bond may be indium, gold or solder. The via hole is about 5 μm deep with an aspect ratio less than or equal to 20.

BRIEF DESCRIPTION OF THE DRAWINGS

The exact nature of this invention, as well as the objects and advantages thereof, will become readily apparent from consideration of the following specification in conjunction with the accompanying drawings in which like reference numerals designate like parts throughout the figures thereof and wherein.

DETAILED DESCRIPTION OF THE PREFERRED EMBODIMENTS

An apparatus and method is provided herein for a buried via in three dimensional integrated circuits. The buried via does not interrupt the routing at all metal layers and avoids full penetration of the wafer. The buried via may be used to interconnect between metal layers on adjacent active circuit layers from separate dies or wafers with no or less exclusion area constraints as compared to a through via interconnect. As a result, the apparatus and method provided herein allow improved electrical interconnects of three dimensional integrated circuits with state of the art IC technologies.

Figure 1:
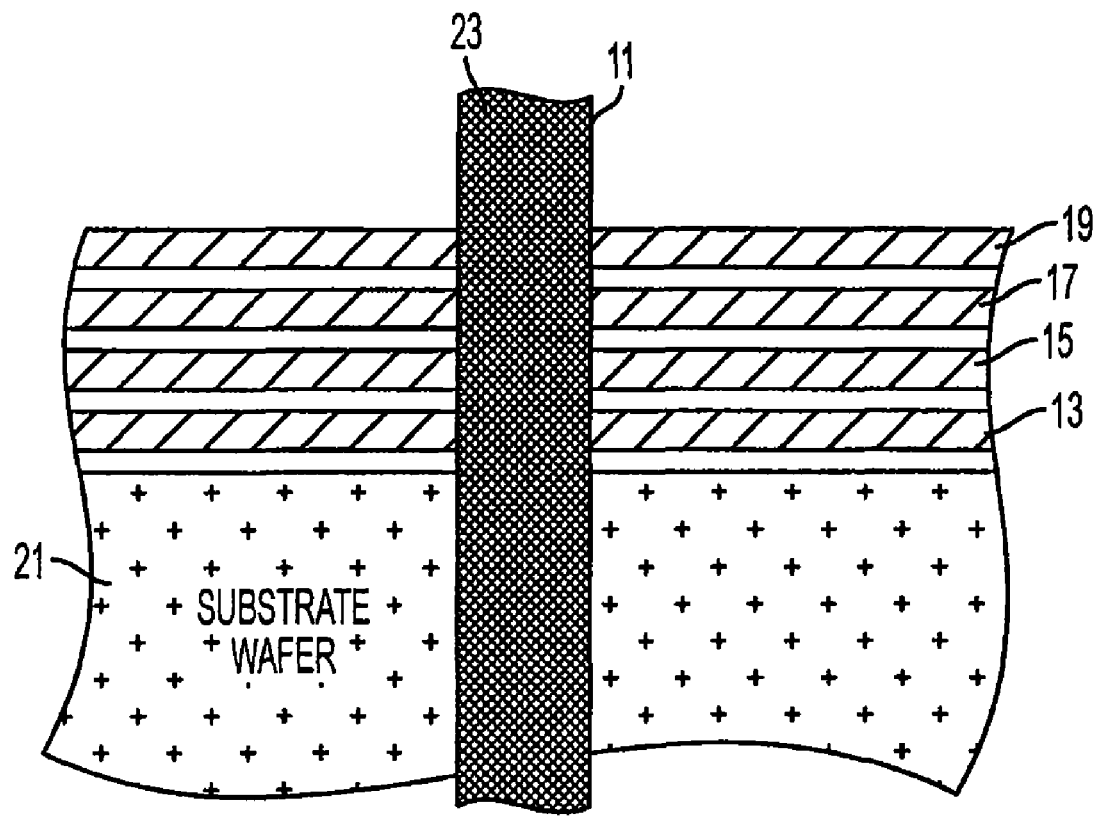
FIG. 1 is a cross sectional view of a prior art three dimensional integrated circuit with a through via.
Figure 2:
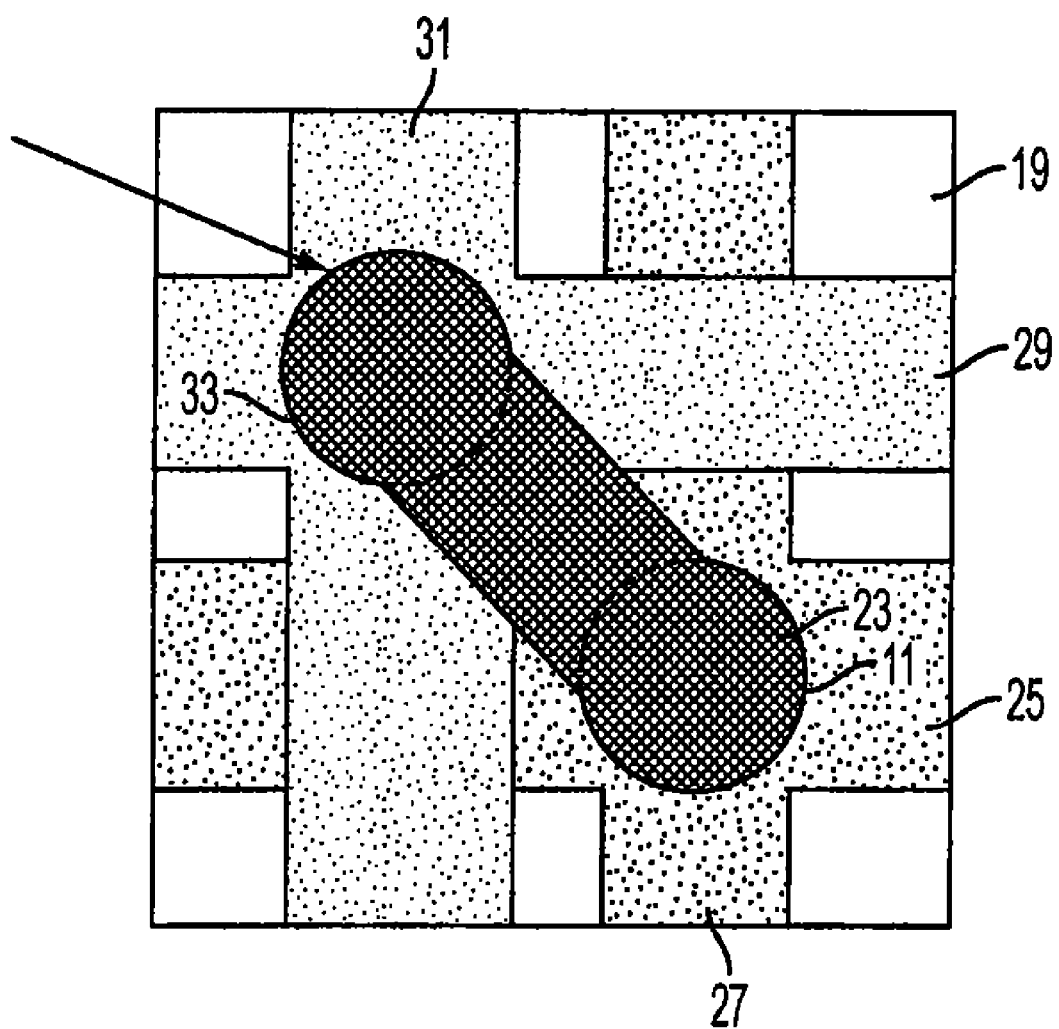
FIG. 2 is a top view of the prior art three dimensional integrated circuit of FIG. 1, illustrating an interruption of routing streets by a landing pad and the through via.
Figure 3:
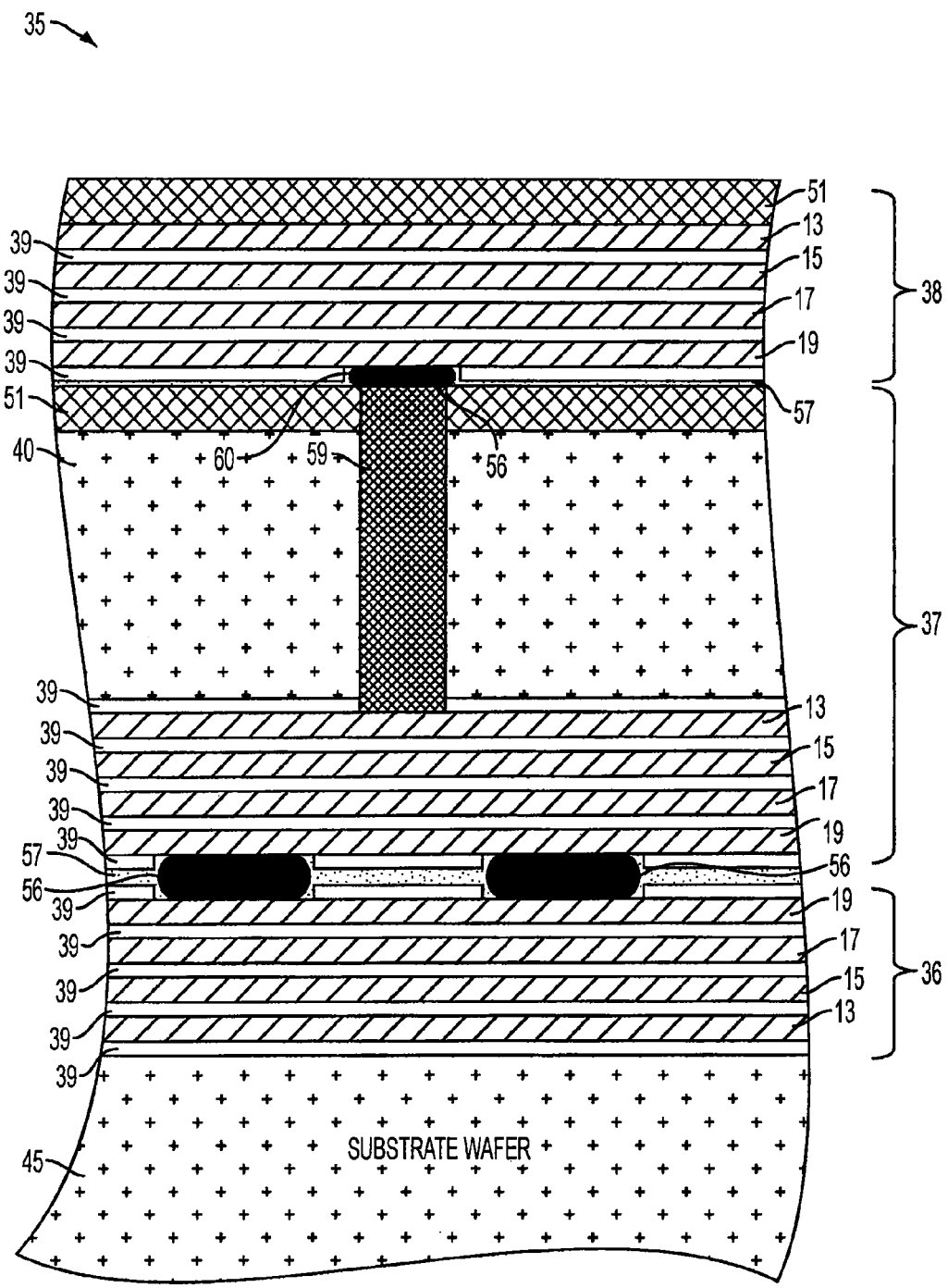
FIG. 3 is a cross sectional view of a three dimensional integrated circuit with a buried via at the wafer level, according to an embodiment of the invention.

FIG. 3 is a cross sectional view of a three dimensional integrated circuit 35 with a buried via 59, according to an embodiment of the invention. The three dimensional integrated circuit 35 has three layers: a first active circuit layer 36, a second active circuit layer 37 and a third active circuit layer 38. A bond material 56, such as indium, gold or solder, may be used to couple the first active circuit layer 36 to the second active circuit layer 37 and/or the second active circuit layer 37 to the third active circuit layer 38. An under fill 57 may be used to enhance mechanical strength between the layers 36, 37 or 38.

Each active circuit layer 36, 37 or 38 may have one or more metal layers 13, 15, 17 or 19 to create lateral electrical interconnects between circuit components. Preferably, a dielectric layer 39, such as silicon dioxide, is used as an electrical insulator to surround metal layers 13, 15, 17 and/or 19.

The second active circuit layer 37 also includes a buried oxide layer 51, a semiconductor substrate layer 40, and a buried via 59. The second active circuit layer 37 is processed using a wafer with a buried oxide layer 51 as used, for example, in Silicon On Insulator (SOI) CMOS process technologies. The buried oxide layer 51 serves as an etch stop when removing the underlying wafer material. Preferably, the second active circuit layer 37 has a thickness of about 10 micron. The buried via 59 is processed by etching through the buried oxide layer 51, the thin substrate layer 40 and the dielectric layer 39. The buried via 59 connects metal layer 13 of layer 37 to metal layer 19 of layer 38. The buried oxide layer 51 is preferably about 1 μm thick. The semiconductor substrate layer 40 may be a silicon layer of about 5 μm thickness.

Figure 22:
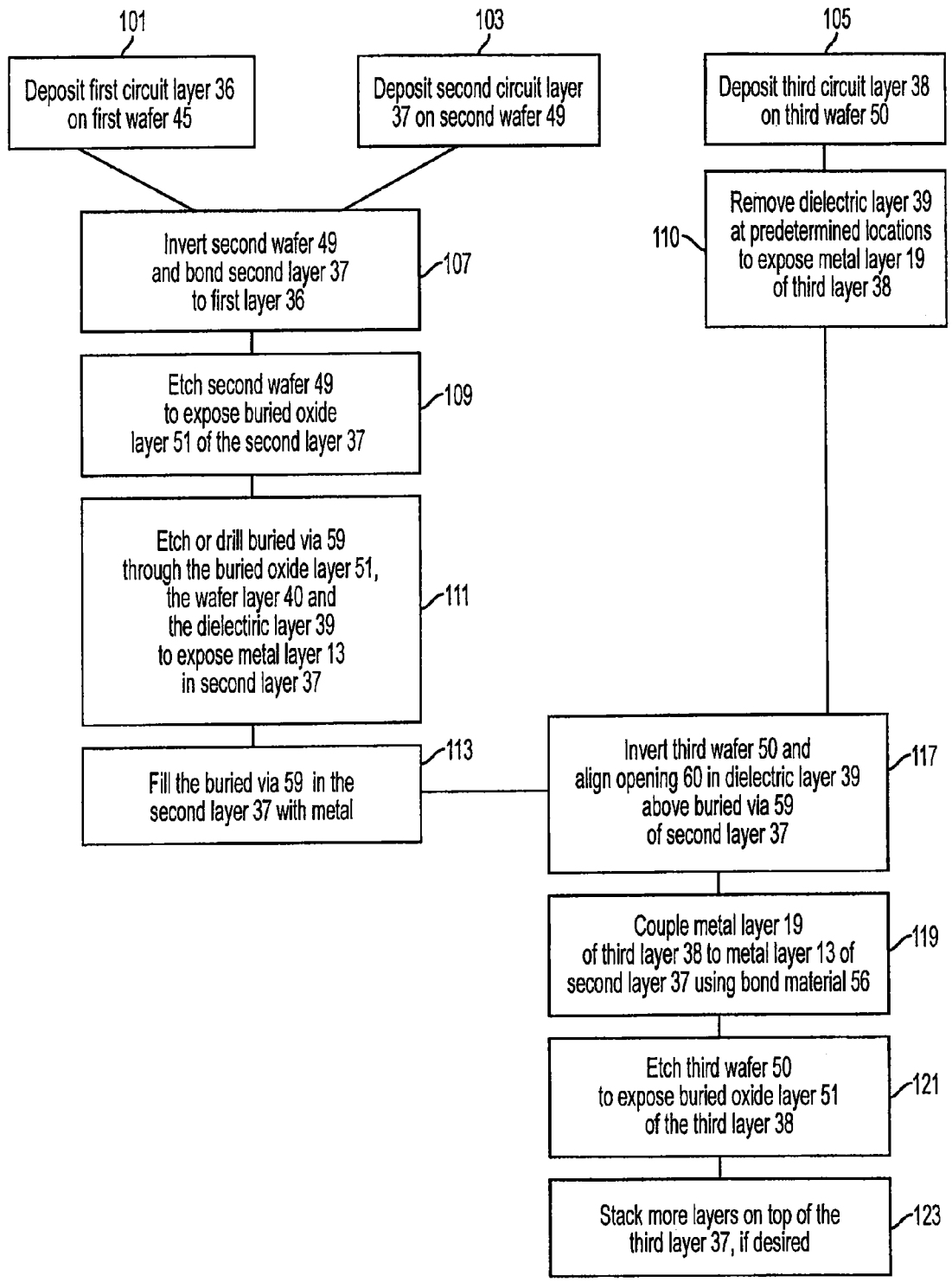
FIG. 22 is a flow chart illustrating the fabrication steps for buried interconnect vias at the wafer level, according to an embodiment of the invention.

To manufacture three dimensional integrated circuits 35, a plurality of layers 36, 37 and 38 of active circuitry are stacked up one on top of the other. FIGS. 4-10 are graphic illustrations of the fabrication steps for buried interconnect vias at the wafer level, according to an embodiment of the invention. FIG. 22 is a flow chart illustrating the fabrication steps for buried interconnect vias at the wafer level.

Figure 4:
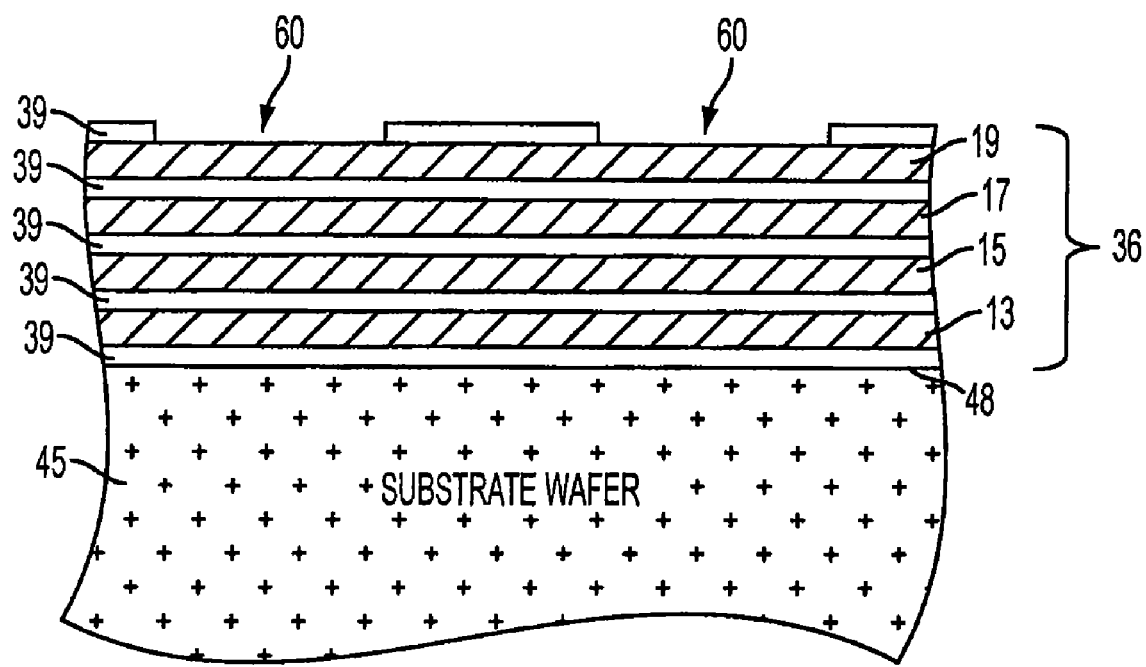
FIG. 4-10 are graphic illustrations of the fabrication steps for buried interconnect vias at the wafer level, according to an embodiment of the invention.

Referring to FIGS. 4 and 22, the first active circuit layer 36 may be deposited and/or grown on one side 48 of a first wafer 45 by processes well known in the art (101). Preferably, the first active circuit layer 36 has one or more metal layers 13, 15, 17 or 19 for lateral interconnects between active circuitry. Each metal layer 13, 15, 17 or 19 has a thickness of about 1 μm. A dielectric layer 39, such as silicon dioxide, may be deposited between metal layers 13, 15, 17 and/or 19. The first active circuit layer 36 may have an opening 60 in the dielectric layer 39 to expose metal layer 19. The first wafer 45 may be about 200 to 400 μm thick, while the first active circuit layer 36 may be about 5 μm thick.

Figure 5:
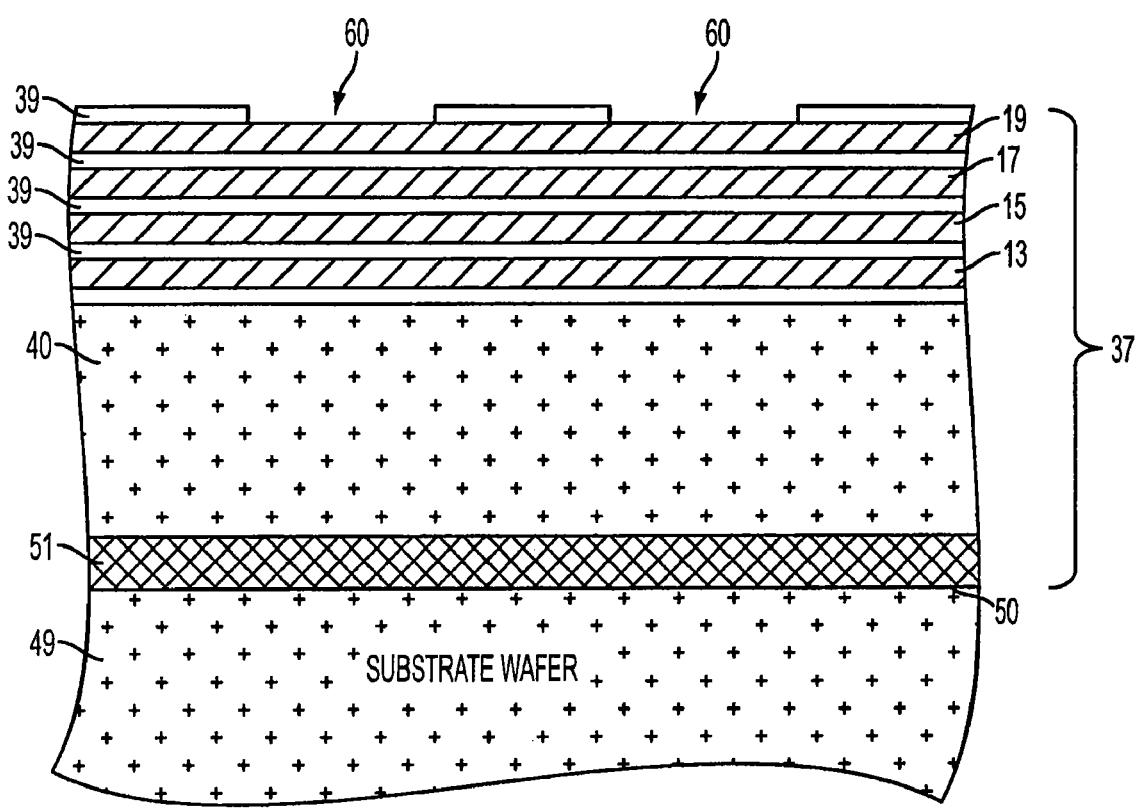

The second active circuit layer 37 may be deposited and/or grown on one side 50 of a second wafer 49 (103), as shown in FIG. 5. Preferably, the second active circuit layer 37 has one or more metal layers 13, 15, 17 or 19 for lateral interconnects between active circuitry. Each metal layer 13, 15, 17 or 19 has a thickness of about 1 μm. Dielectric layer 39 may be deposited between metal layers 13, 15, 17 and/or 19. The second active circuit layer 37 may have an opening 60 in the dielectric layer 39 to expose metal layer 19. The second active circuit layer 37 may also include the substrate layer 40 and the buried oxide layer 51. The substrate layer 40 may be a silicon layer of about 5 μm thick. The buried oxide layer 51 may be silicon dioxide of about 1 μm thick. The buried oxide layer 51 may be grown on the second wafer 49. The substrate layer 40 and metal layers 13, 15, 17 or 19 are then deposited on top of the buried oxide layer 51. The second wafer 49 may have a thickness of about 200 to 400 μm.

Figure 6:
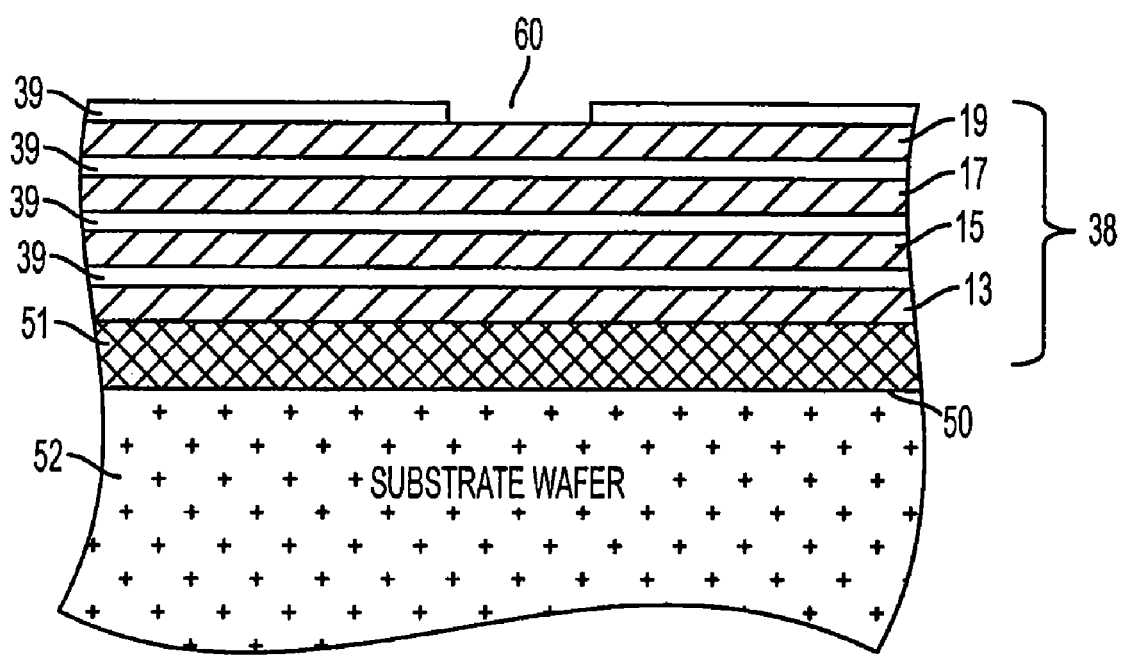

The third active circuit layer 38 may be deposited and/or grown on one side 50 of a third wafer 52 (105), as shown in FIG. 6. Preferably, the third active circuit layer 38 has one or more metal layers 13, 15, 17 or 19 for lateral interconnects between active circuitry. Each metal layer 13, 15, 17 or 19 has a thickness of about 1 μm. Buried oxide layer 51 may be grown on the third wafer 50. Metal layers 13, 15, 17 or 19 are then deposited on top of the buried oxide layer 51. Dielectric layer 39 may be deposited between the metal layers 13, 15, 17 and/or 19. The third active circuit layer 38 may have an opening 60 in the dielectric layer 39 to expose metal layer 19 (115). The third wafer 52 may be about 200 to 400 μm thick, while the third active circuit layer 38 may be about 5 μm thick.

Metal layers 13, 15, 17 and/or 19 have a predetermined shape and size. Depending on design characteristics, the metal layers 13, 15, 17 and/or 19 may be selectively deposited in layers 36, 37 and/or 38. A first stencil mask (not shown) may be used to selectively deposit a metal layer 13, 15, 17 or 19 using lithography techniques well known in the art. A dielectric 39, such as silicon dioxide, may be deposited thereafter to embed the metal layer 13, 15, 17 or 19 within the layer 36, 37 or 38.

Figure 7:
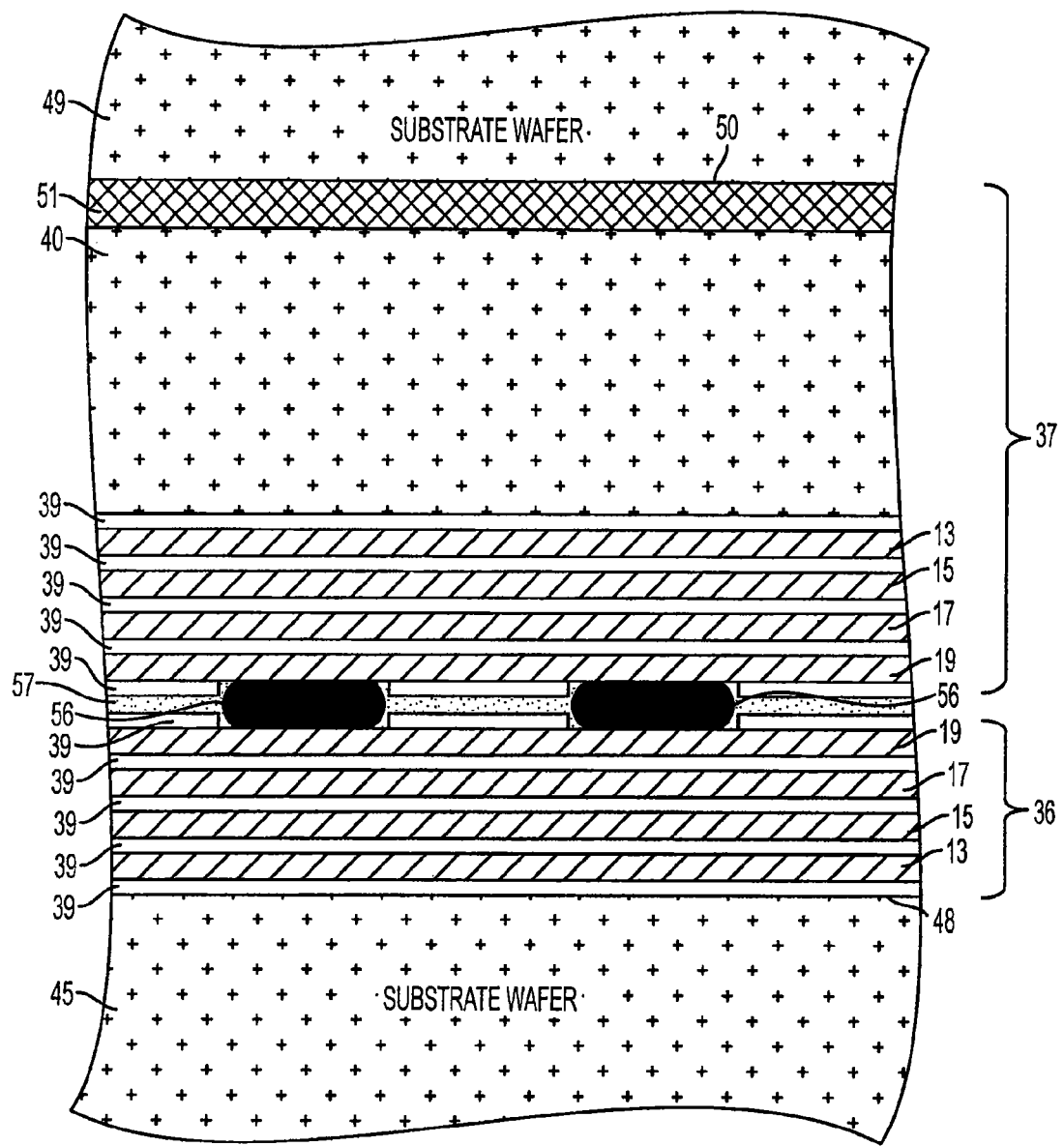

Referring to FIG. 7, the second wafer 49 may be inverted to allow the bonding of the second active circuit layer 37 to the first active circuit layer 36 (107). The bond material 56 may include indium, gold and/or solder. Under fill 57 may be used to enhance the bonding between the second active circuit layer 37 and the first active circuit layer 36.

Figure 8:
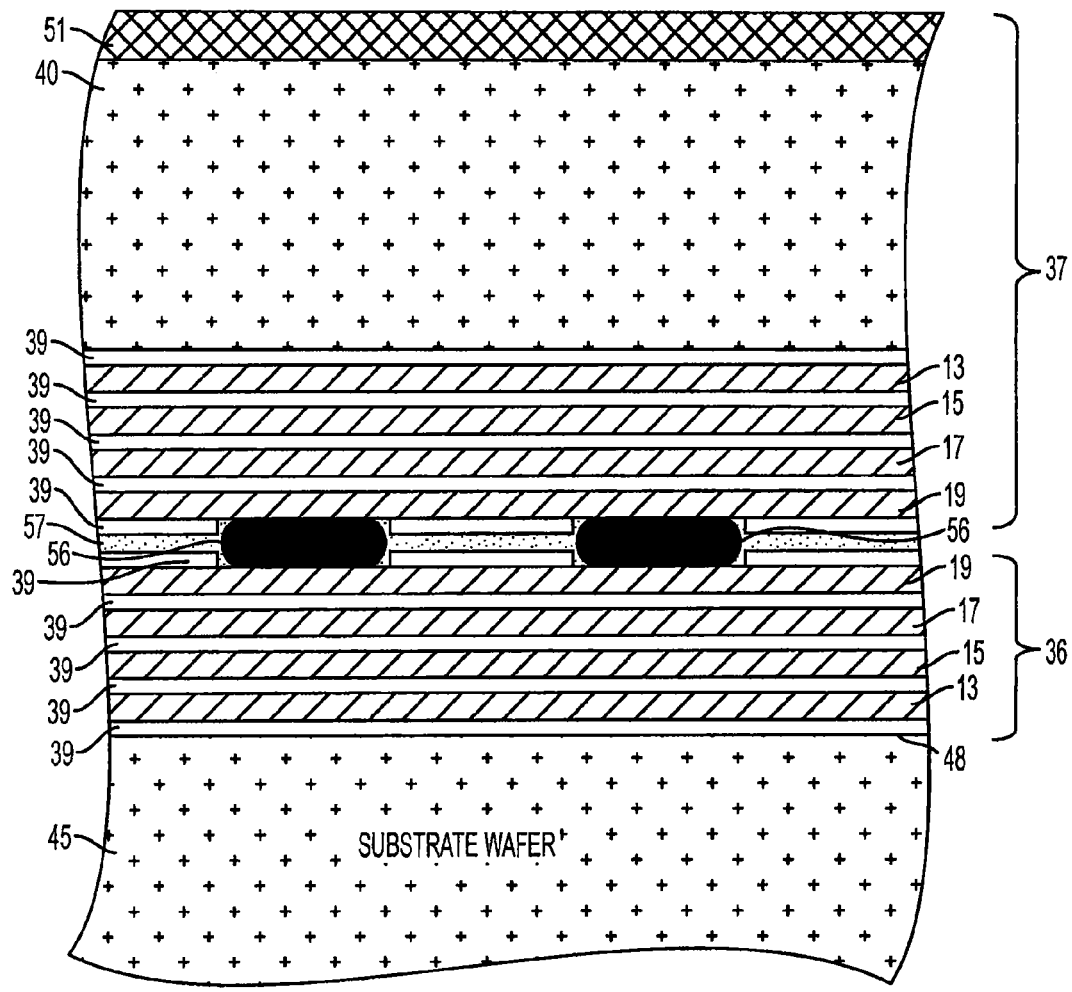

Next, the second wafer 49 is removed in a controlled manner using, for example, a dry etch process, as shown in FIG. 8. To provide depth control, the buried oxide layer 51 may be used as an etch stop. When the second wafer 49 is removed, the buried oxide layer 51 becomes exposed (109).

Figure 9:
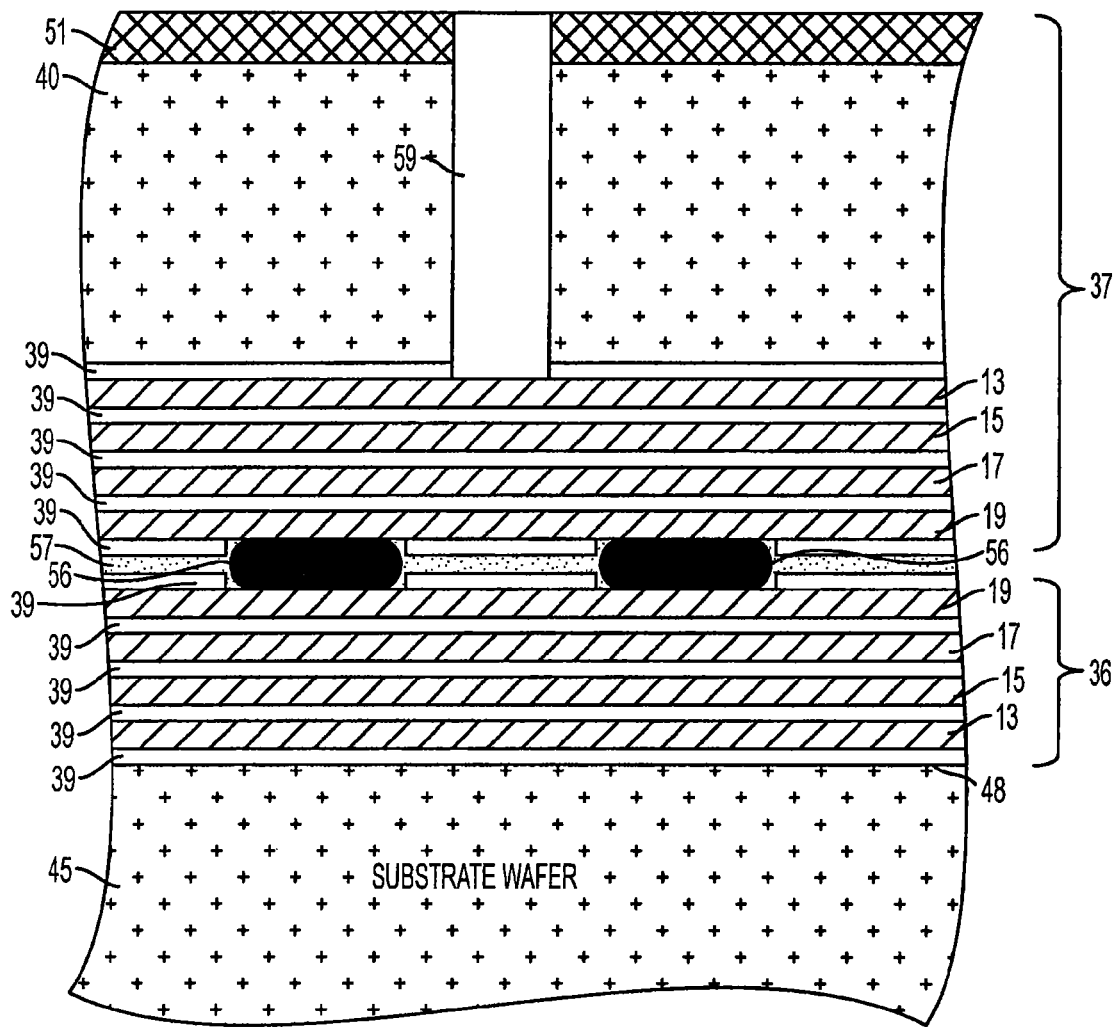
Figure 10:
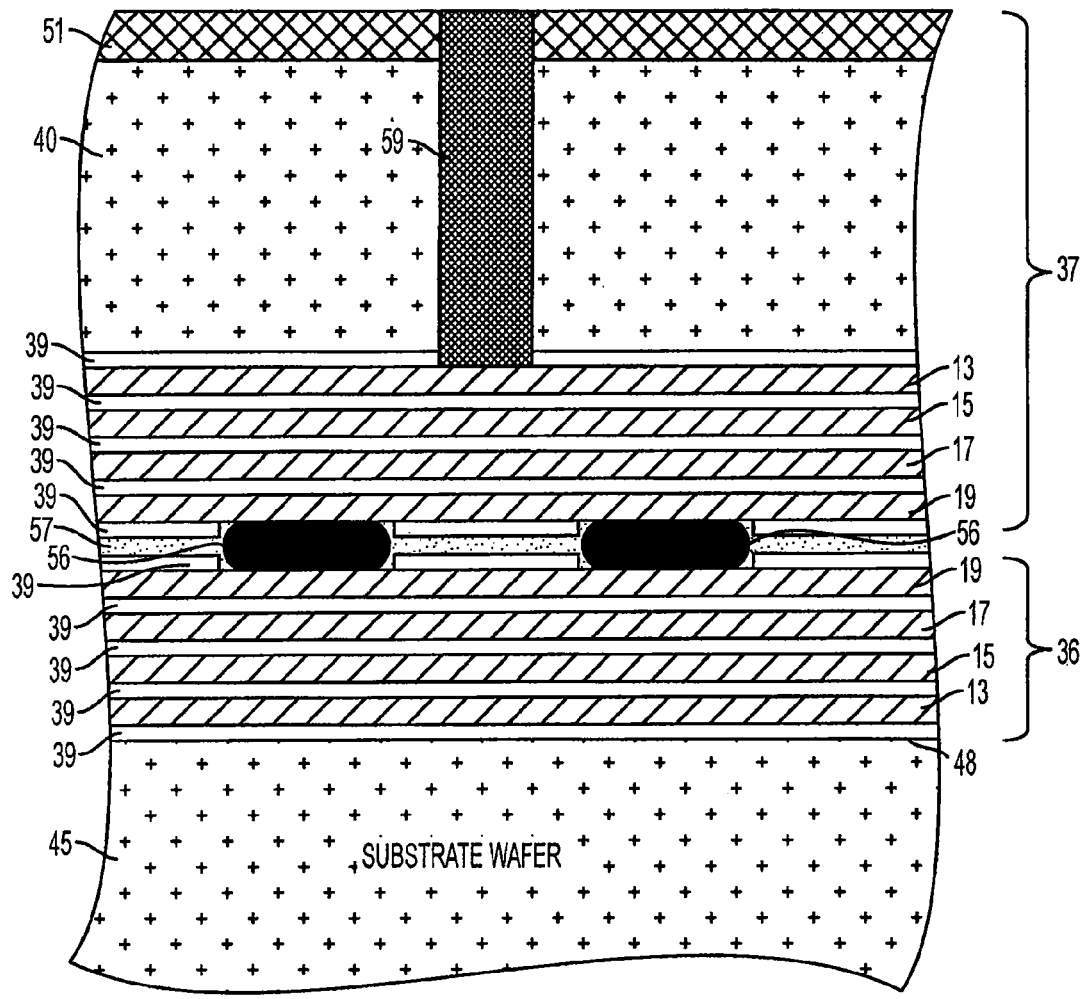

In FIG. 9, the buried via 59 may be formed, for example, by selectively etching through the buried oxide layer 51, the substrate layer 40 and the dielectric layer 39 until metal layer 13 is exposed (111). The buried via 59 may be used to connect between two metal layers of different active circuit layers. The buried via 59 preferably has a depth of about 5 μm and an aspect ratio less than or equal to 20. According to an embodiment of the invention, the buried via 59 is filled with metal (113), as shown in FIG. 10. Since the buried via 59 is relatively shallow because of its low aspect ratio, metal deposition inside the buried via 59 is fairly simple and unrestrained by capillary forces or deposition shadowing effects. The metal inside buried via 59 is in contact with the metal layer 13 of layer 37. While not shown, dielectric isolation layers may also be applied to electronically isolate the metal of via 59 from the substrate layer 40.

To add more layers to the three dimensional integrated circuit 35, the fabrication steps illustrated in FIGS. 7-10 may be used. For example, the third wafer 52 may be inverted to allow the bonding of the third active circuit layer 38 to the second active circuit layer 37 (117). Bond material 56 and under fill 57 may be used to enhance the bonding between the third active circuit layer 38 and the second active circuit layer 37. The opening 60 in the third active circuit layer 38 may be aligned above the buried via 59 to expose metal layer 19 of the third active circuit layer 38 to the bond material 56, as shown in FIG. 3. Since bond material 56 is coupled to the metal inside the buried via 59, which is coupled to the metal layer 13 of layer 37, the buried via 59 connects metal layer 13 of layer 37 to metal layer 19 of layer 38 (119). Finally, the third wafer 52 may be removed in a controlled manner using, for example, a dry etch process (121). To provide depth control, the buried oxide layer 51 may be used as an etch stop. Depending on design characteristics, more layers with or without buried vias 59 may be stacked on top of third active circuit layer 37 to construct the three dimensional integrated circuit 35 (123).

In one embodiment, the first active circuit layer 36 is a sacrificial layer that provides mechanical support for the thin second active circuit layer 37. The first active circuit layer 36 may be removed after the second active circuit layer 37 is hybridized to the third active circuit layer 38.

Since wafers may be defective, for example, due to manufacturing, the use of wafers in three dimensional integrated circuits provides an accumulation of yield loss. If one wafer, or parts of it, is not functioning, then a second wafer coupled to the first wafer, will also not function. To minimize yield loss, known good dies may be used in three dimensional integrated circuits. The dies are tested separately and known good ones are used.

Figure 11:
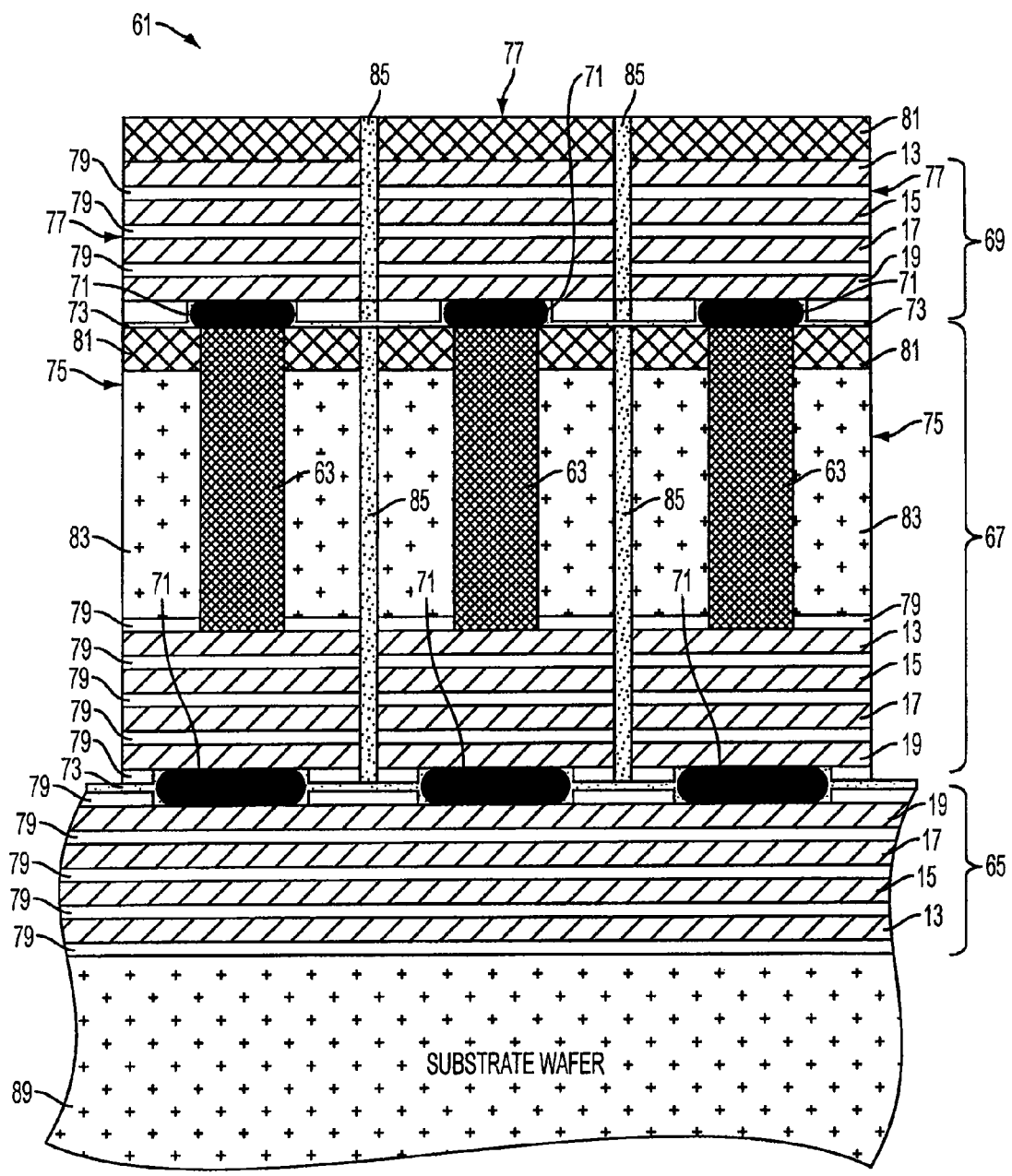
FIG. 11 is a cross sectional view of a three dimensional integrated circuit with a buried via using know good dies on top of an active circuit layer wafer, according to an embodiment of the invention.

FIG. 11 is a cross sectional view of a three dimensional integrated circuit 61 with one or more buried vias 63, according to an embodiment of the invention. The three dimensional integrated circuit 61 has three layers: a first active circuit layer 65, a second active circuit layer 67 and a third active circuit layer 69. The first active circuit layer 65 may be a handling wafer or handling circuit. The second active circuit layer 67 may have a plurality of known good dies 75 with buried via 63. The third active circuit layer 69 may have a plurality of known good dies 77. If another layer is stacked above the third active circuit layer 69, then known good dies 77 may also include buried via 63.

Each active circuit layer 65, 67 or 69 may have one or more metal layers 13, 15, 17 or 19 for lateral interconnects between active circuitry with a thickness of about 1 μm. Preferably, a dielectric layer 79, such as silicon dioxide, is used as an electrical insulator to surround metal layers 13, 15, 17 and/or 19.

The second active circuit layer 67 also includes a buried oxide layer 81, a semiconductor substrate layer 83, and a buried via 63. The second active circuit layer 67 is processed using a wafer with a buried oxide layer 81 as used, for example, in Silicon On Insulator (SOI) CMOS process technologies. The buried oxide layer 81 serves as an etch stop when removing the underlying wafer material. Preferably, the second active circuit layer 67 has a thickness of about 10 micron. The buried via 63 is processed by etching through the buried oxide layer 81, the substrate layer 83 and the dielectric layer 79. The buried via 63 connects metal layer 13 of layer 67 to metal layer 19 of layer 69. The buried oxide layer 81 is preferably about 1 μm thick. The substrate layer 83 may be a silicon layer of about 5 μm thickness.

A bond material 71, such as indium, gold or solder, may be used to couple the first active circuit layer 65 to the second active circuit layer 67 and/or the second active circuit layer 67 to the third active circuit layer 69. An under fill 73 may be used to enhance the bonding between the layers 65, 67 or 69. An etch protection fill 85 may be used to provide mechanical support to known good dies 75 on the second active circuit layer 67. Similarly, the etch protection fill 85 may be used to provide mechanical support to known good dies 77 on the third active circuit layer 69.

Figure 12:
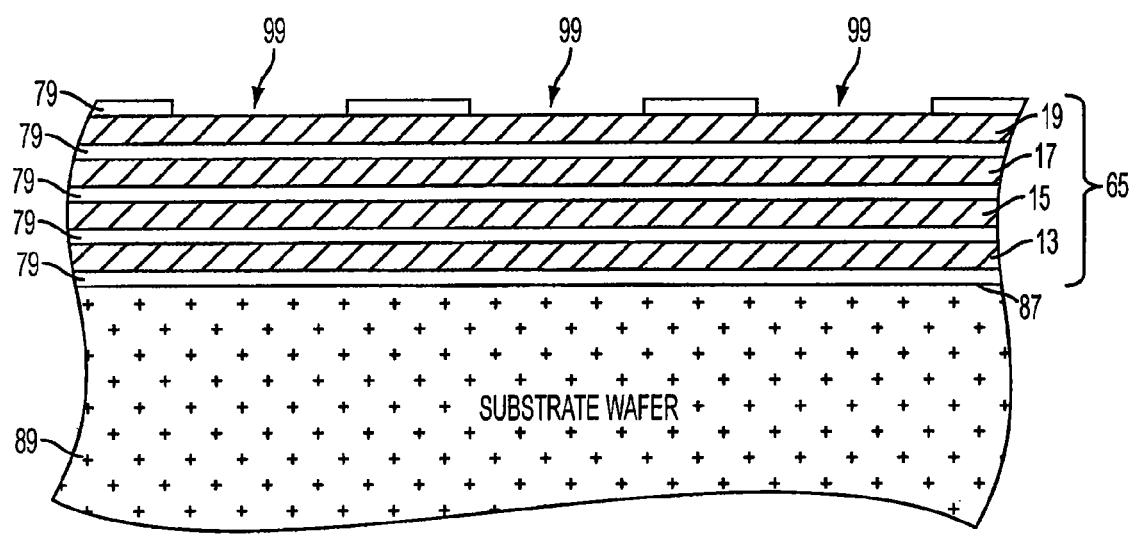
FIGS. 12-21 are graphic illustrations of the fabrication steps for buried interconnect vias at the die level, according to an embodiment of the invention.
Figure 23:
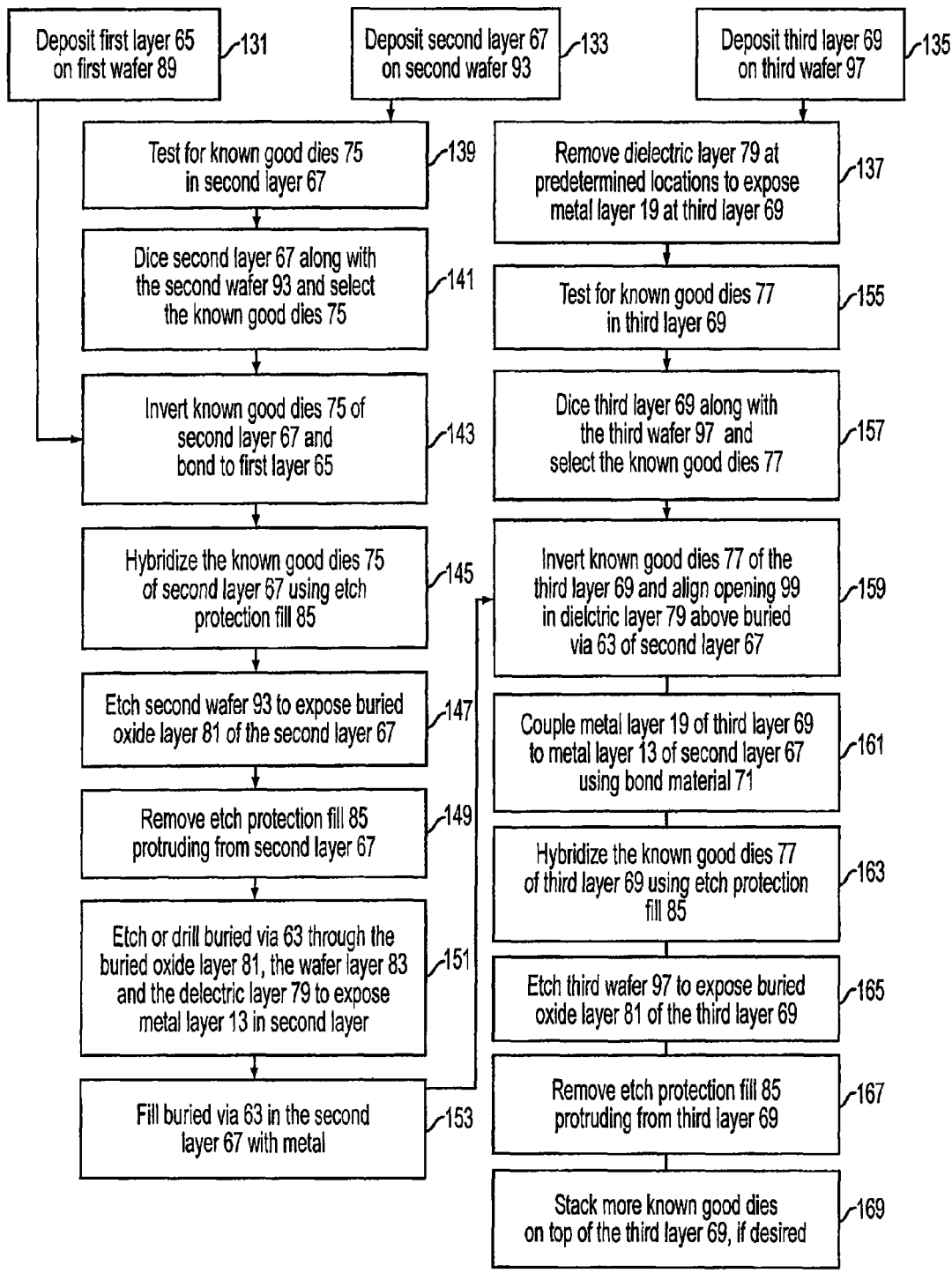
FIG. 23 is a flow chart illustrating the fabrication steps for buried interconnect vias at the die level, according to an embodiment of the invention.

FIGS. 12-21 are graphic illustrations of the fabrication steps for buried interconnect vias at the die level, according to an embodiment of the invention. FIG. 23 is a flow chart illustrating the fabrication steps for buried interconnect vias at the die level. Referring to FIG. 12, the first active circuit layer 65 may be deposited and/or grown on one side 87 of a first wafer 89 by processes well known in the art (131).

Preferably, the first active circuit layer 65 has one or more metal layers 13, 15, 17 or 19 for lateral interconnects between active circuitry. Each metal layer 13, 15, 17 or 19 has a thickness of about 1 μm. A dielectric layer 79, such as silicon dioxide, may be deposited between metal layers 13, 15, 17 and/or 19. The first active circuit layer 65 may have an opening 99 in the dielectric layer 79 to expose metal layer 19. The first wafer 89 may be about 200 to 400 μm thick, while the first active circuit layer 65 may be about 5 μm thick.

Figure 13:
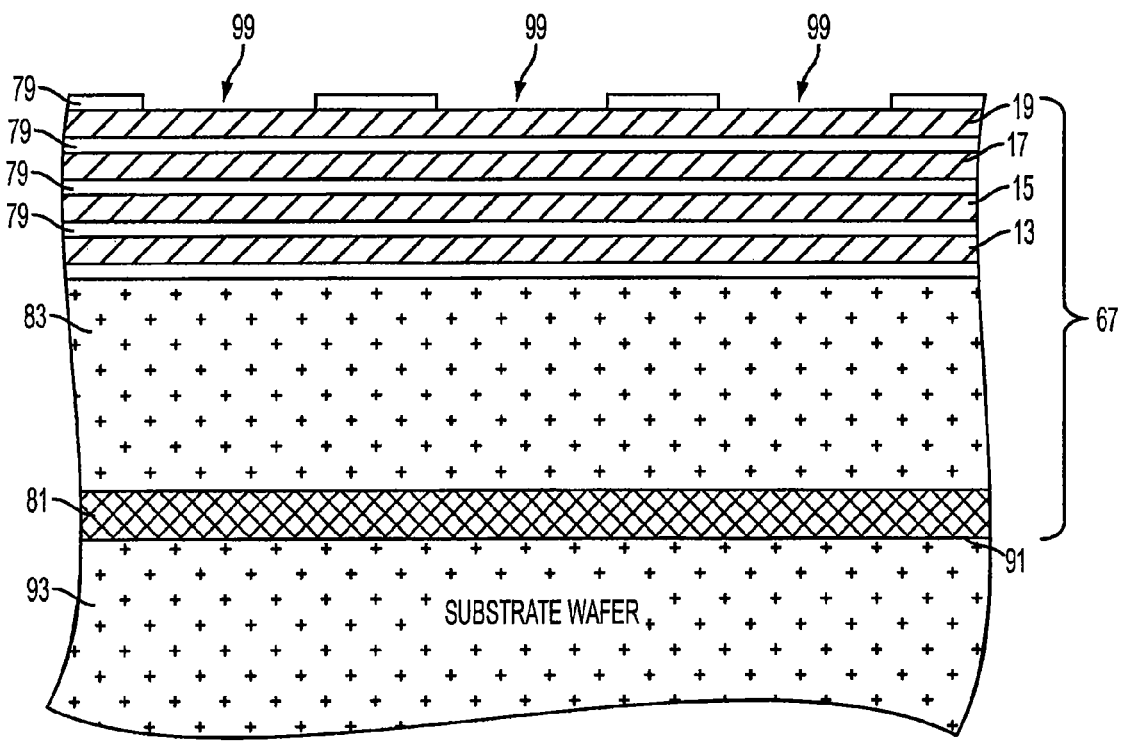

The second active circuit layer 67 may be deposited and/or grown on one side 91 of a second wafer 93 (133), as shown in FIG. 13. Preferably, the second active circuit layer 67 has one or more metal layers 13, 15, 17 or 19 for lateral interconnects between active circuitry. Each metal layer 13, 15, 17 or 19 has a thickness of about 1 μm. Dielectric layer 79 may be deposited between metal layers 13, 15, 17 and/or 19. The second active circuit layer 67 may have an opening 99 in the dielectric layer 79 to expose metal layer 19. The second active circuit layer 67 may also include the substrate layer 83 and the buried oxide layer 81. The substrate layer 83 may be a silicon layer of about 5 μm thick. The buried oxide layer 81 may be silicon dioxide of about 1 μm thick. The buried oxide layer 81 may be grown on the second wafer 93. The substrate layer 83 and metal layers 13, 15, 17 or 19 are then deposited on top of the buried oxide layer 81. The second wafer 93 may have a thickness of about 200 to 400 μm.

Figure 14:
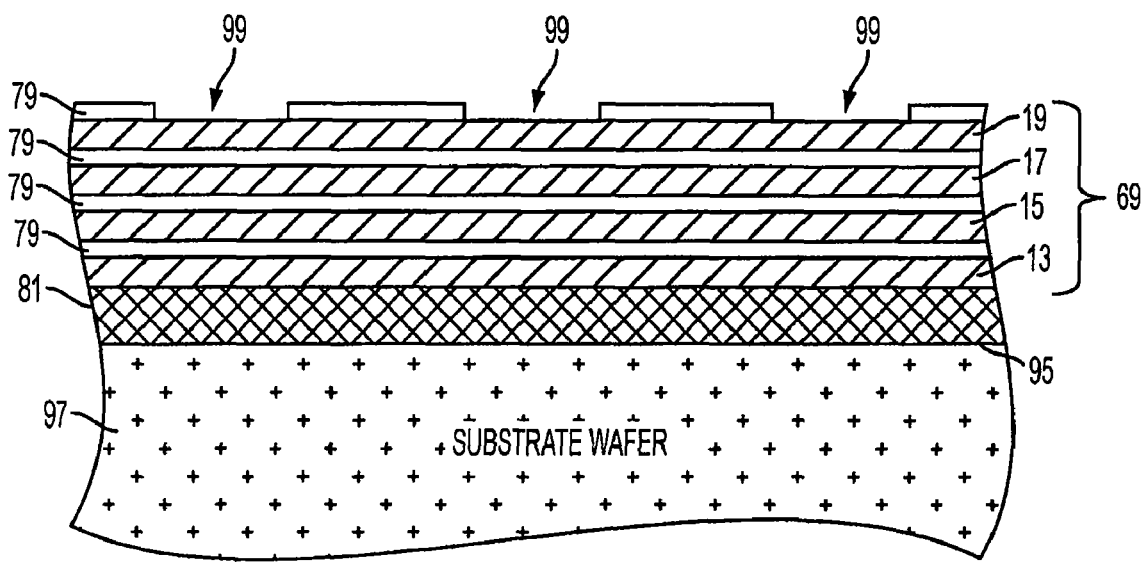

The third active circuit layer 69 may be deposited and/or grown on one side 95 of a third wafer 97 (135), as shown in FIG. 14. Preferably, the third active circuit layer 69 has one or more metal layers 13, 15, 17 or 19 for lateral interconnects between active circuitry. Each metal layer 13, 15, 17 or 19 has a thickness of about 1 μm. Buried oxide layer 81 may be grown on the third wafer 97. Metal layers 13, 15, 17 or 19 are then deposited on top of the buried oxide layer 81. Dielectric layer 79 may be deposited between the metal layers 13, 15, 17 and/or 19. The third active circuit layer 69 may have an opening 99 in the dielectric layer 79 to expose metal layer 19 (137). The third wafer 97 may be about 200 to 400 μm thick, while the third active circuit layer 69 may be about 5 μm thick.

Metal layers 13, 15, 17 and/or 19 have a predetermined shape and size. Depending on design characteristics, the metal layers 13, 15, 17 and/or 19 may be selectively deposited in layers 65, 67 and/or 69. A first stencil mask (not shown) may be used to selectively deposit a metal layer 13, 15, 17 or 19 using lithography techniques well known in the art. A dielectric 79, such as silicon dioxide, may be deposited thereafter to embed the metal layer 13, 15, 17 or 19 within the layer 65, 67 or 69.

Figure 15:
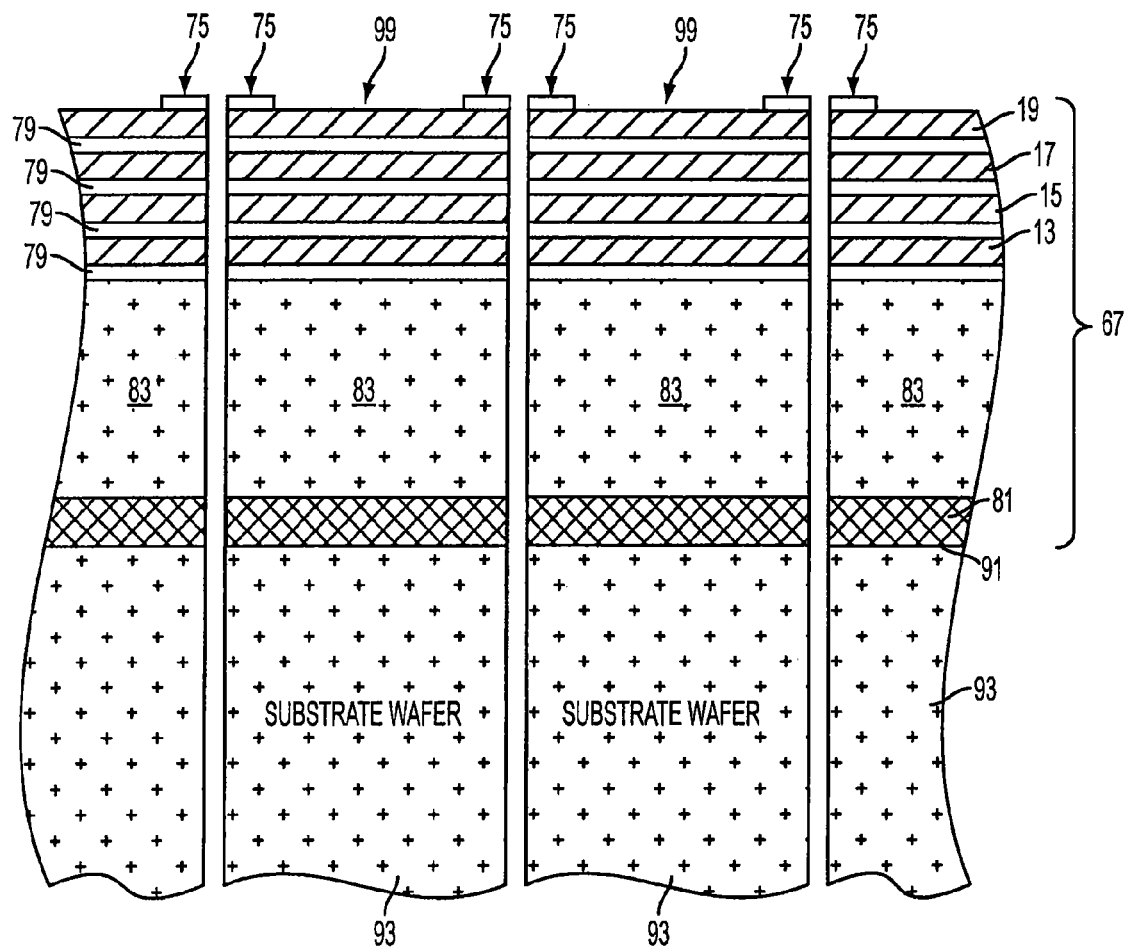

To minimize yield loss for three dimensional integrated circuits 61, known good dies 75 in the second active circuit layer 67 are used. The dies 75 are tested separately in the second active circuit layer 67 (139). The second active circuit layer 67 along with the second wafer 93 are then diced, as shown in FIG. 15, and the known good dies 75 are selected (141).

Figure 16:
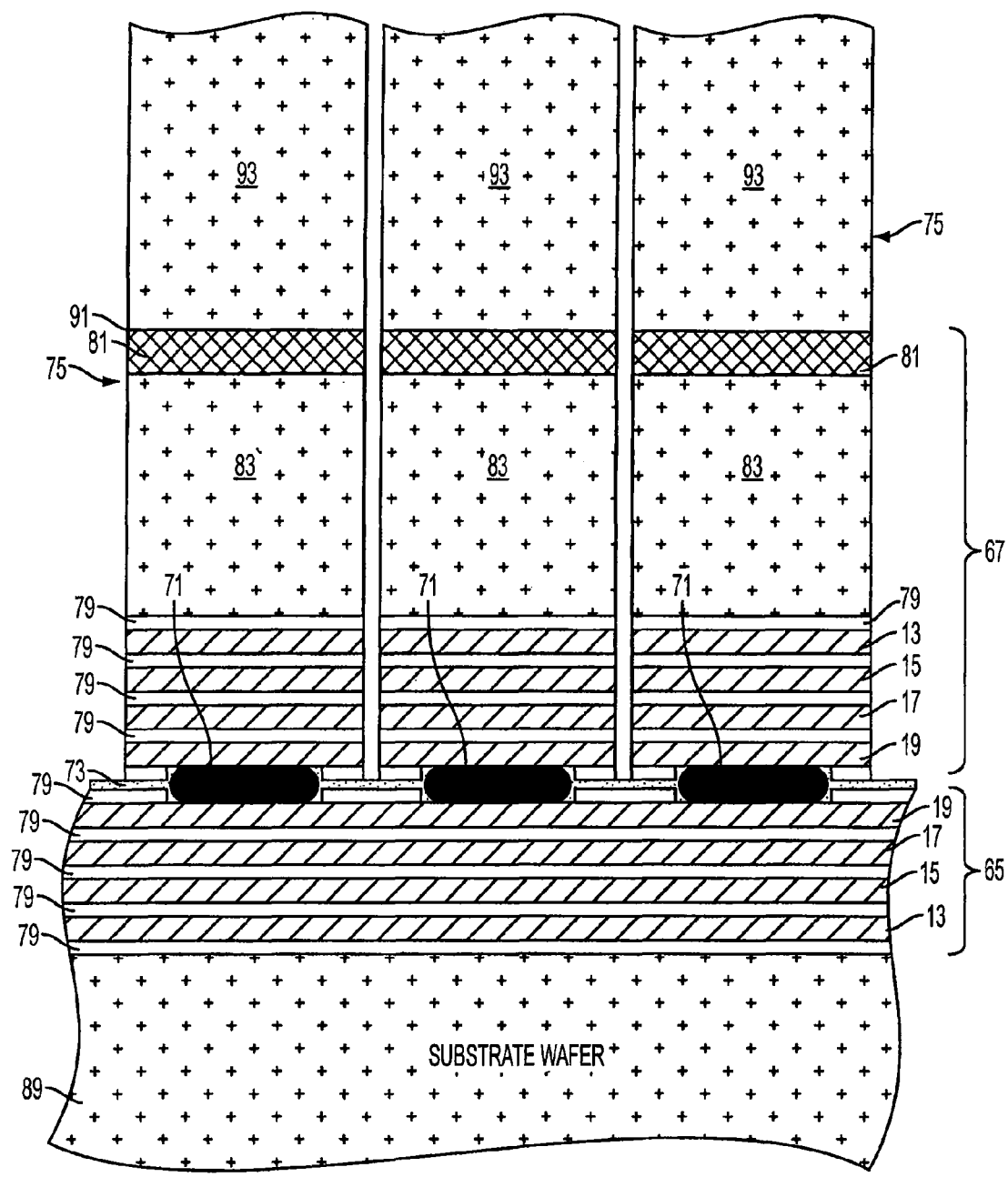

Referring to FIG. 16, the known good dies 75 of second active circuit layer 67 may be inverted to allow the bonding of the second active circuit layer 67 to the first active circuit layer 65 (143). The bond material 71 may include indium, gold and/or solder. Under fill 73 may be used to enhance the bonding between the second active circuit layer 67 and the first active circuit layer 65 by countering the effect of mismatches in coefficient of thermal expansion between the layers 65 and 67 and the bond material 71.

Figure 17:
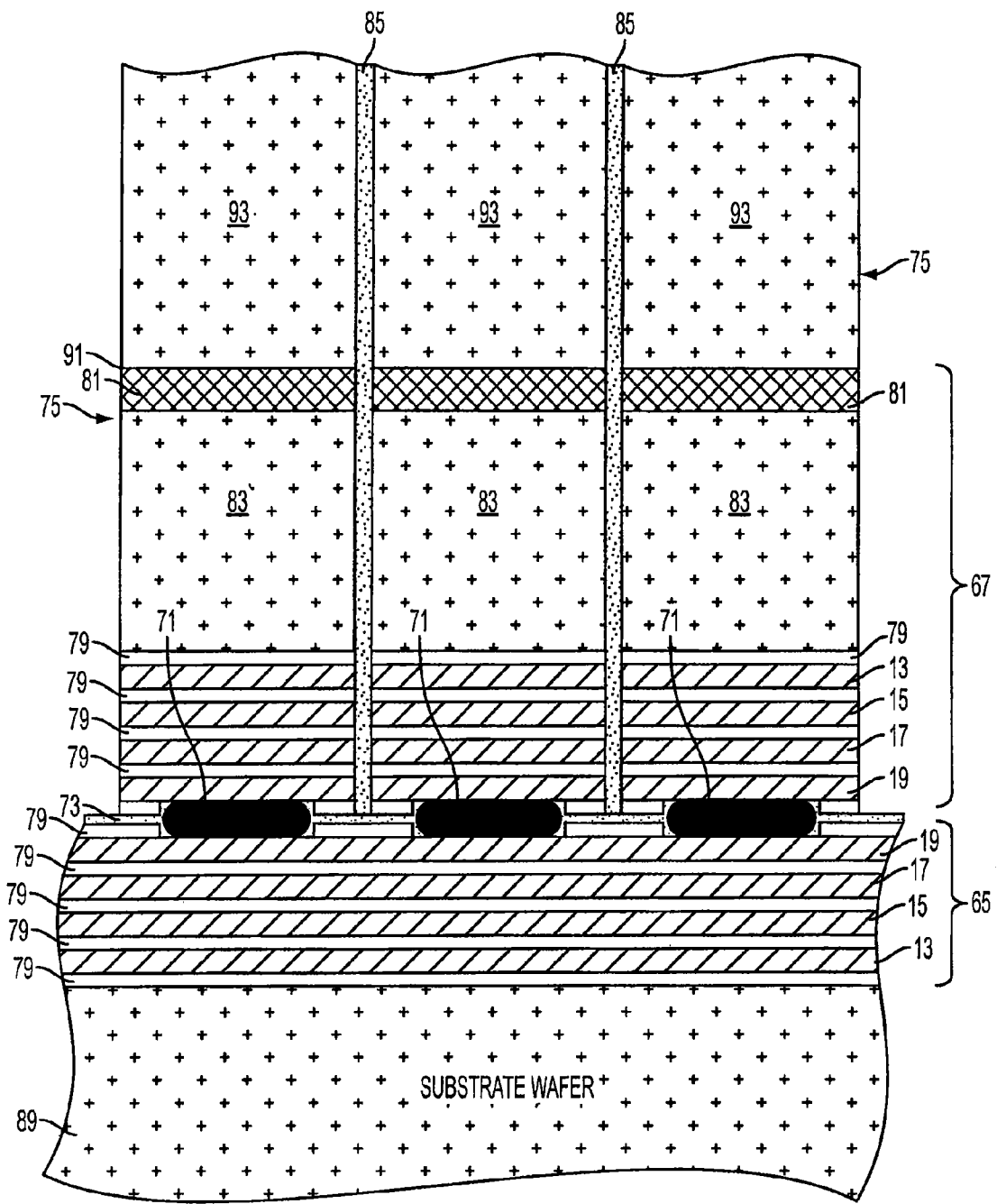

Next, an etch protection fill 85, such as a photo resist, epoxy, or other curable liquid, may be used to enhance the mechanical stability of known good dies 75 on the first active circuit layer 65 (145), as shown in FIG. 17. The gaps between known good dies 75 are filled in with the etch protection fill 85 to mechanically hold the dies 75 together.

Figure 18:
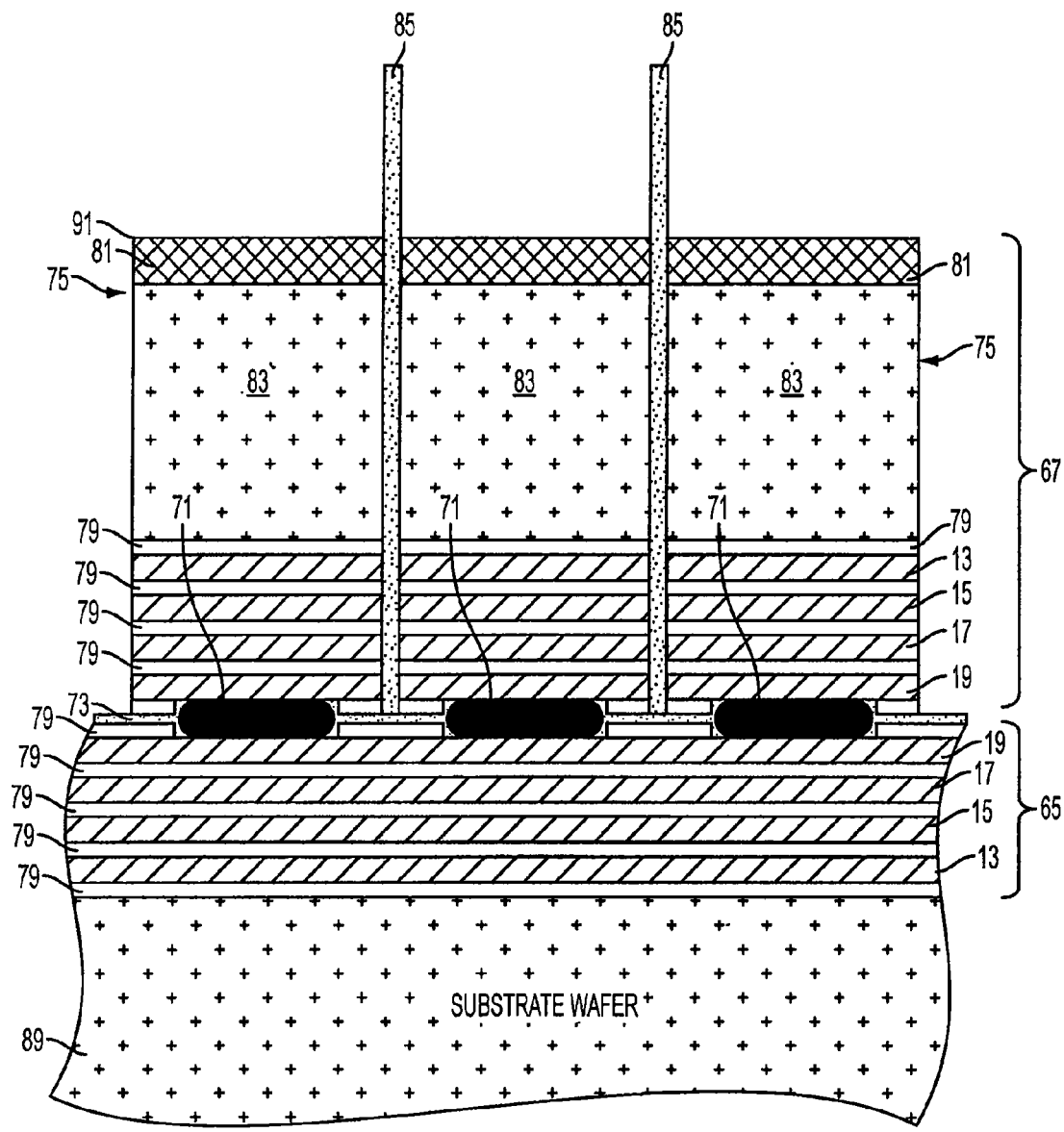
Figure 19:
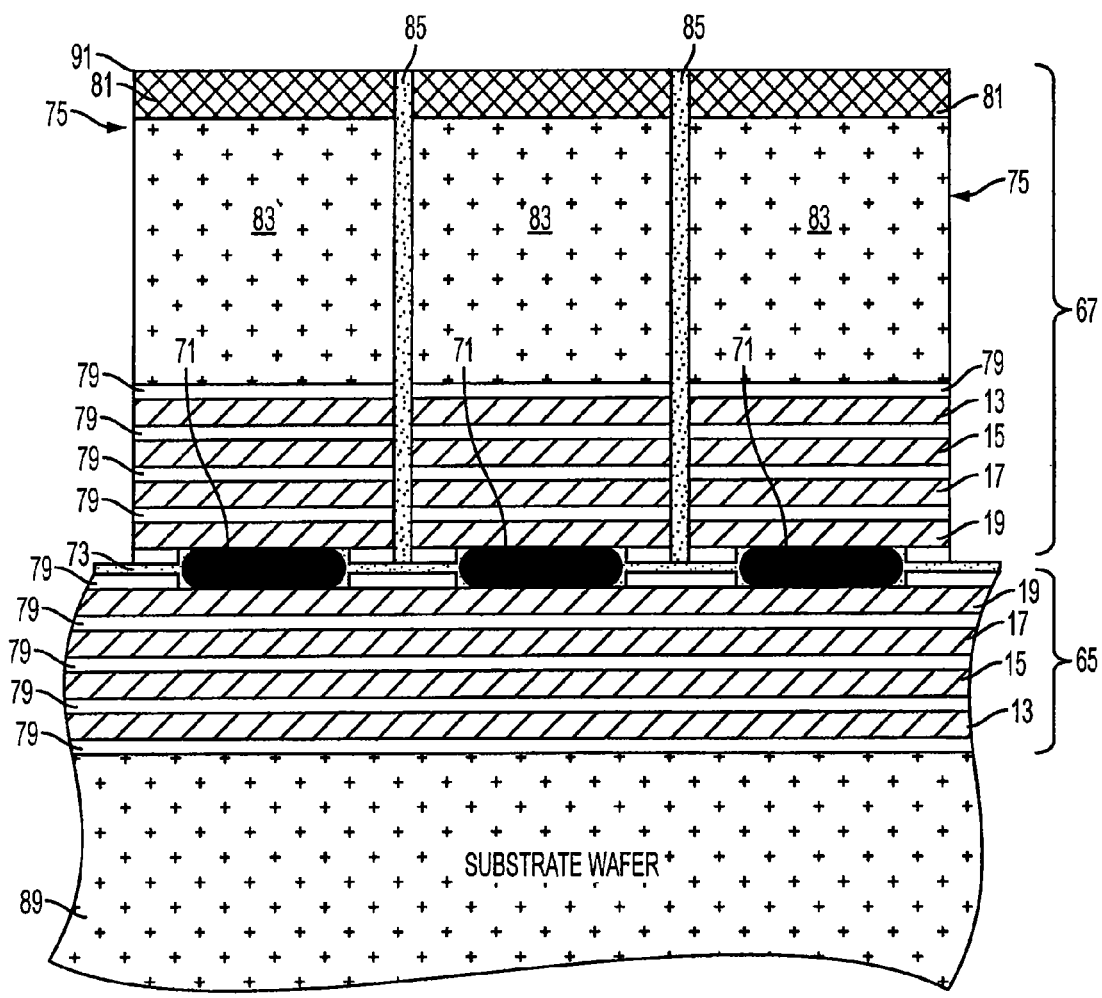

The second wafer 93 may then be removed in a controlled manner using, for example, a dry etch process (147), as shown in FIG. 18. To provide depth control, the buried oxide layer 81 may be used as an etch stop. When the second wafer 93 is removed, the buried oxide layer 81 and the etch protection fill 85 become exposed. The exposed etch protection fill 85 protruding from second active circuit layer 67 is then removed (149), as shown in FIG. 19.

Figure 20:
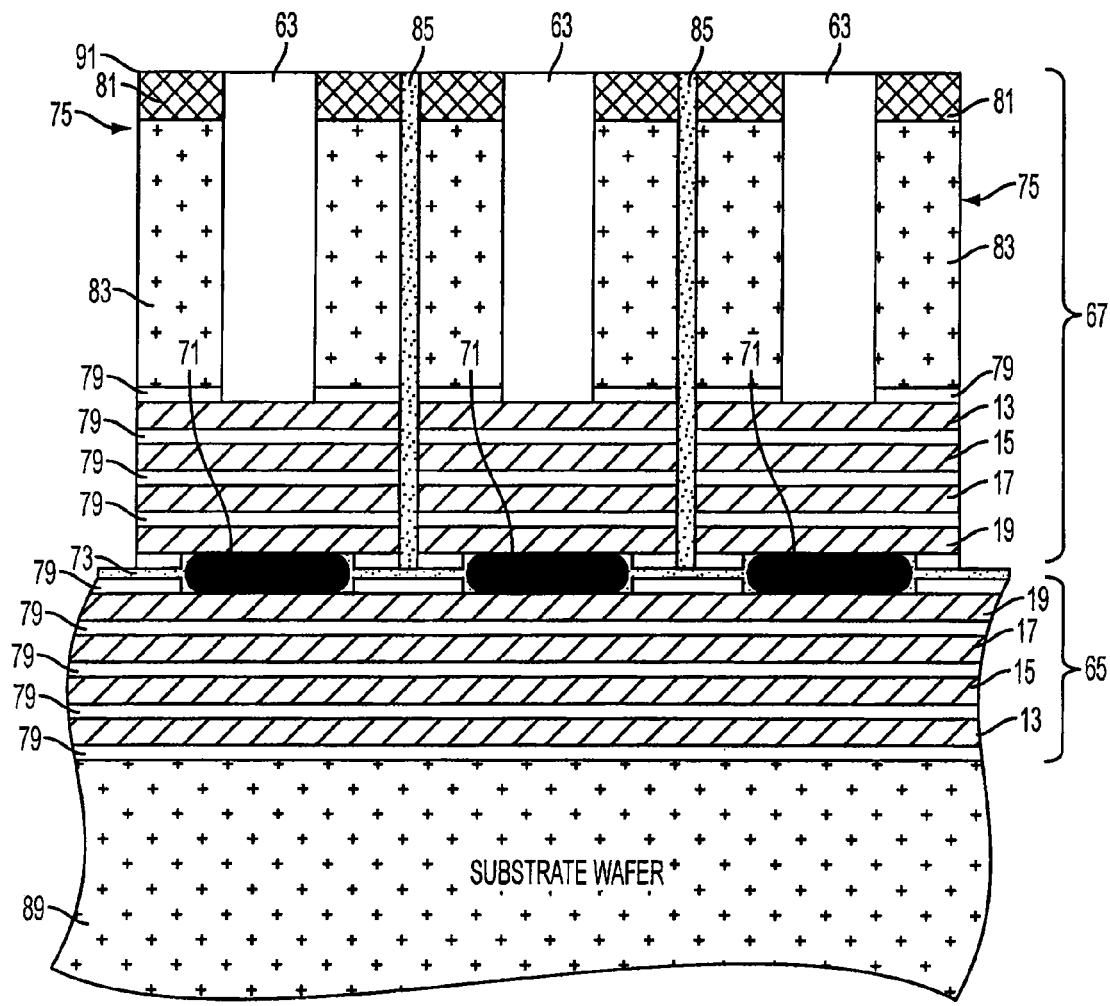
Figure 21:
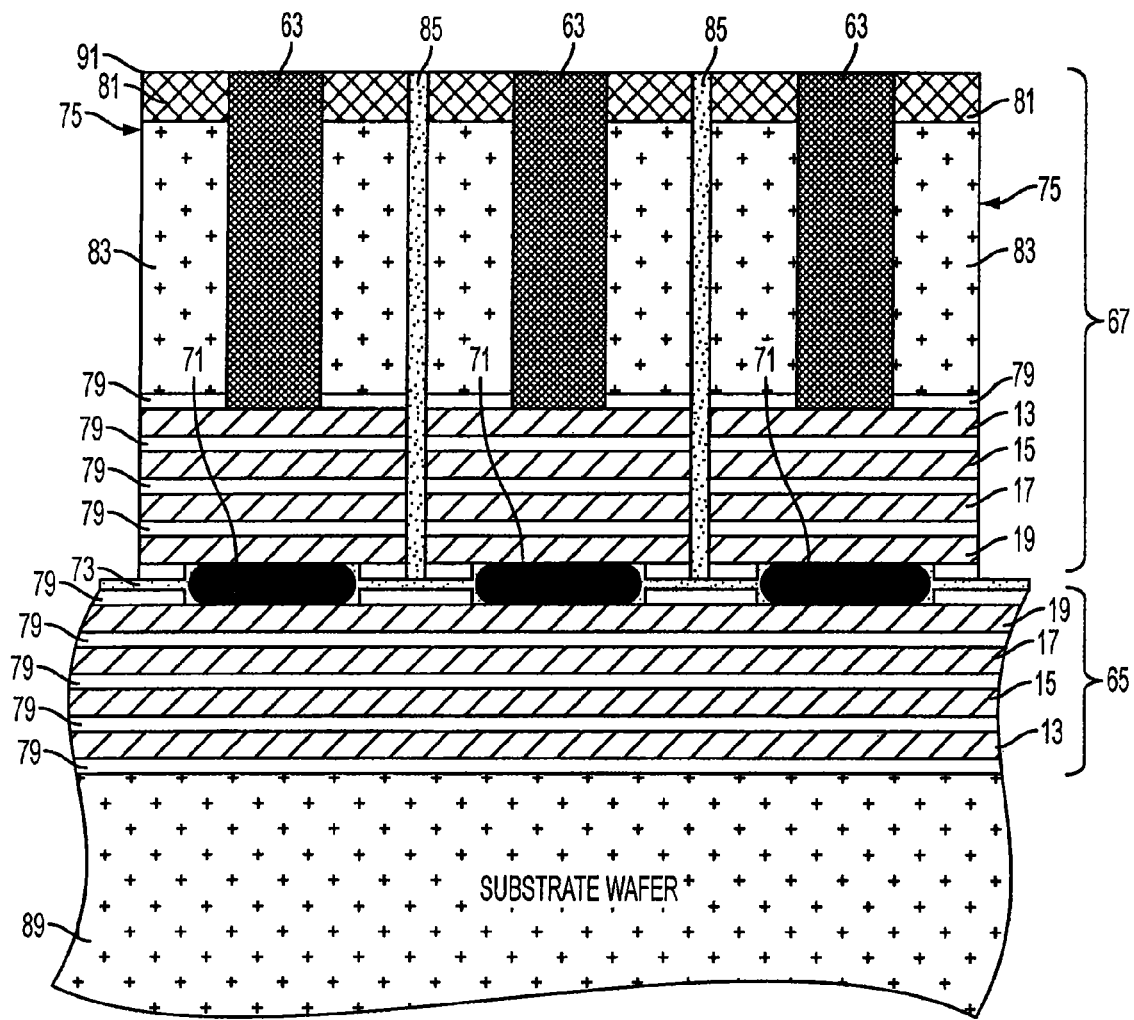

In FIG. 20, the buried via 63 may be formed, for example, by selectively etching or drilling through the buried oxide layer 81, the substrate layer 83 and the dielectric layer 79 until metal layer 13 is exposed (151). The buried via 63 may be used to connect between two metal layers of different active circuit layers. The buried via 63 preferably has a depth of about 5 μm and an aspect ratio less than or equal to 20. According to an embodiment of the invention, the buried via 63 is filled with metal (153), as shown in FIG. 21. Since the buried via 63 is relatively shallow because of its low aspect ratio, metal deposition inside the buried via 63 is fairly simple and unrestrained by capillary forces or deposition shadowing. The metal inside buried via 63 is in contact with the metal layer 13 of layer 67. While not shown, dielectric isolation layers may also be applied to electrically isolate the metal of via 63 from the substrate layer 83.

To add more layers to the three dimensional integrated circuit 61, the fabrication steps illustrated in FIGS. 15-19 may be used. For example, the third active circuit layer 69 is tested and known good dies 77 are identified (155). The third active circuit layer 69 along with the third wafer 97 is diced and the known good dies are selected (157). The known good dies 77 of the third active circuit layer 69 may be inverted to allow the bonding of the third active circuit layer 69 to the second active circuit layer 67 while exposing the third wafer 97 for dry etching. Bond material 71 and under fill 73 may be used to enhance the bonding between the third active circuit layer 69 and the second active circuit layer 67. The opening 99 in the third active circuit layer 69 may be aligned above the buried via 63 to expose metal layer 19 of the third active circuit layer 69 to the bond material 71 (159), as shown in FIG. 11. Since bond material 71 is coupled to the metal inside the buried via 63, which is coupled to the metal layer 13 of layer 67, the buried via 63 connects metal layer 13 of layer 67 to metal layer 19 of layer 69 (161).

Next, an etch protection fill 85, such as a photo resist, epoxy, or other curable liquid, may be used in the hybridization process of known good dies 77 and the third wafer 97 (163). The gaps between the known good dies 77 are filled in with the etch protection fill 85 to mechanically hold the dies 77 together. The third wafer 97 may be removed in a controlled manner using, for example, a dry etch process (165). To provide depth control, the buried oxide layer 81 may be used as an etch stop. Finally, any exposed etch protection under fill 85 protruding from third active circuit layer 69 are removed (167). Depending on design characteristics, more known good dies with or without buried vias 63 may be stacked on top of third active circuit layer 69 to construct the three dimensional integrated circuit 61 (169).

In one embodiment, the first active circuit layer 65 is a sacrificial layer that provides mechanical support for the thin second active circuit layer 67. The first active circuit layer 65 may be removed after the second active circuit layer 67 is hybridized to the third active circuit layer 69.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other changes, combinations, omissions, modifications and substitutions, in addition to those set forth in the above paragraphs, are possible. Those skilled in the art will appreciate that various adaptations and modifications of the just described preferred embodiment can be configured without departing from the scope and spirit of the invention. Therefore, it is to be understood that, within the scope of the appended claims, the invention may be practiced other than as specifically described herein.

What is claimed is:

1. A fabrication method for a three dimensional integrated circuit having a first and a second active circuit layer, the first active circuit layer has a first metal layer inside the first active circuit layer, the second active circuit layer has a second metal layer, the method comprising:
   etching a via in the first active circuit layer to expose the first metal layer without penetrating the first metal layer;
   depositing metal inside the via, the metal inside the via being in contact with the first metal layer; and
   bonding the second active circuit layer to the first active circuit layer using a metal bond that connects the metal inside the via to the second metal layer of the second active circuit layer.

2. The fabrication method of claim 1, wherein the second metal layer is inside the second active circuit layer.

3. The fabrication method of claim 1, further comprising the step of coupling the first active circuit layer to the second active circuit layer using an under fill.

4. The fabrication method of claim 1, wherein the metal bond is selected from a group consisting of indium, gold and solder.

5. The fabrication method of claim 1, wherein the via is about 5 μm deep.

6. The fabrication method of claim 1, wherein the via has an aspect ratio less than or equal to 20.

7. A fabrication method for a three dimensional integrated circuit having a first and a second known good die, the first known good die has a first metal layer inside the first known good die, the second known good die has a second metal layer, the method comprising:
   etching a via in the first known good die to expose the first metal layer;
   depositing metal inside the via, the metal inside the via being in contact with the first metal layer; and
   bonding the second known good die to the first known good die using a metal bond that connects the metal inside the via to the second metal layer of the second known good die.

8. The fabrication method of claim 7, wherein the second metal layer is inside the second known good die.

9. The fabrication method of claim 7, further comprising the step of coupling the first known good die to the second known good die using an under fill.

10. The fabrication method of claim 7, wherein the metal bond is selected from a group consisting of indium, gold and solder.

11. The fabrication method of claim 7, wherein the via is about 5 μm deep.

12. The fabrication method of claim 7, wherein the via has an aspect ratio of less than or equal to 20.

13. A fabrication method for a three dimensional integrated circuit, the method comprising:
   placing a first active circuit layer on a first substrate and a second active circuit layer on a second substrate, the first active circuit layer having a first metal layer, a semiconductor substrate layer and a buried oxide layer, the first metal layer is embedded in a first dielectric material, the semiconductor substrate layer separates the buried oxide layer from the first dielectric material, the second active circuit layer having a second metal layer embedded in a second dielectric material;
   hybridizing the first active circuit layer to a handling wafer;
   etching the first substrate from the first active circuit layer using the buried oxide layer as an etch stop;
   etching a via through the buried oxide layer, the semiconductor substrate layer and the first dielectric material to expose the first metal layer in the first active circuit layer without penetrating the first metal layer;
   depositing metal inside the via, the metal inside the via being in contact with the first metal layer;
   etching an opening in the second dielectric material to expose the second metal layer in the second active circuit layer;
   aligning the opening in the second active circuit layer with the via of the first active circuit layer; and
   hybridizing the second active circuit layer to the first active circuit layer using a metal bond that connects the metal inside the via to the second metal layer of the second active circuit layer.

14. The fabrication method of claim 13, further comprising the step of coupling the first active circuit layer to the second active circuit layer using an under fill.

15. The fabrication method of claim 13, wherein the metal bond is selected from a group consisting of indium, gold and solder.

16. The fabrication method of claim 13, wherein the via is about 5 μm deep.

17. The fabrication method of claim 13, wherein the via has an aspect ratio less than or equal to 20.

18. The fabrication method of claim 13, wherein the first active circuit layer is bonded to the handling wafer using an under fill.

19. The fabrication method of claim 13, wherein the first active circuit layer is bonded to the handling wafer using a metal bond selected from a group consisting of indium, gold and solder.

* * * * *